United States Patent
Hack et al.

(10) Patent No.: US 10,263,050 B2
(45) Date of Patent: Apr. 16, 2019

(54) HYBRID DISPLAY

(71) Applicant: Universal Display Corporation, Ewing, NJ (US)

(72) Inventors: Michael Hack, Princeton, NJ (US); Michael Stuart Weaver, Princeton, NJ (US); William T. Mayweather, III, Robbinsville, NJ (US); Julia J. Brown, Yardley, PA (US); Nicholas J. Thompson, Trenton, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 15/812,229

(22) Filed: Nov. 14, 2017

(65) Prior Publication Data
US 2018/0166512 A1    Jun. 14, 2018

Related U.S. Application Data

(60) Continuation-in-part of application No. 15/810,384, filed on Nov. 13, 2017, now Pat. No. 10,128,319, which is a division of application No. 14/858,875, filed on Sep. 18, 2015, now Pat. No. 9,818,804.

(51) Int. Cl.
*H01L 27/32* (2006.01)
*H01L 33/00* (2010.01)

(52) U.S. Cl.
CPC ...... *H01L 27/3225* (2013.01); *H01L 27/3213* (2013.01); *H01L 27/3218* (2013.01); *H01L 33/00* (2013.01)

(58) Field of Classification Search
CPC . H01L 27/32; H01L 27/3213; H01L 27/3216; H01L 27/3225
See application file for complete search history.

(56) References Cited

U.S. PATENT DOCUMENTS

| 4,769,292 | A | 9/1988 | Tang et al. |
| 5,247,190 | A | 9/1993 | Friend et al. |
| 5,703,436 | A | 12/1997 | Forrest et al. |

(Continued)

FOREIGN PATENT DOCUMENTS

| JP | 2008218300 A | 9/2008 |
| JP | 2008539554 A | 11/2008 |

(Continued)

OTHER PUBLICATIONS

Baldo, et al., "Highly efficient phosphorescent emission from organic electroluminescent devices", Nature, vol. 395, DP- 151-154, 1998.

(Continued)

*Primary Examiner* — Phuc Dang
(74) *Attorney, Agent, or Firm* — Morris & Kamlay LLP

(57) ABSTRACT

A hybrid pixel arrangement for a full-color display is provided, which includes an inorganic LED in at least one sub-pixel, and an organic emissive stack in at least one other sub-pixel. In an embodiment, a first sub-pixel is configured to emit a first color, and includes an inorganic LED, a second sub-pixel is configured to emit a second color, and includes a first organic emissive stack configured to emit an initial color different from the first color. A third sub-pixel is configured to emit a third color different from the initial color.

8 Claims, 11 Drawing Sheets

(56) References Cited

U.S. PATENT DOCUMENTS

| | | |
|---|---|---|
| 5,707,745 A | 1/1998 | Forrest et al. |
| 5,757,139 A | 5/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,280,559 B1 | 8/2001 | Terada et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,984,934 B2 | 1/2006 | Möller et al. |
| 7,038,373 B2 | 5/2006 | Arnold et al. |
| 7,279,704 B2 | 10/2007 | Walters et al. |
| 7,431,968 B1 | 10/2008 | Shtein et al. |
| 7,714,500 B2 | 5/2010 | Hirakata et al. |
| 7,968,146 B2 | 6/2011 | Wagner et al. |
| 7,982,385 B2 | 7/2011 | Kimura et al. |
| 8,040,052 B2 | 10/2011 | Kobayashi |
| 8,084,940 B2 | 12/2011 | Kim et al. |
| 8,125,138 B2 | 2/2012 | Luttgens et al. |
| 8,159,426 B2 | 4/2012 | Chang et al. |
| 8,400,018 B2 | 3/2013 | Joannopoulos et al. |
| 8,502,445 B2 | 8/2013 | Levermore et al. |
| 8,766,531 B1 | 7/2014 | Hack et al. |
| 8,827,488 B2 | 9/2014 | Weaver et al. |
| 8,896,200 B2 | 11/2014 | Huang et al. |
| 9,231,227 B2 | 1/2016 | Weaver et al. |
| 9,385,168 B2 | 7/2016 | Hack et al. |
| 9,424,772 B2 | 8/2016 | Hack et al. |
| 9,590,017 B2 | 3/2017 | Hack et al. |
| 2003/0178936 A1 | 9/2003 | Park et al. |
| 2003/0230980 A1 | 12/2003 | Forrest et al. |
| 2004/0032205 A1 | 2/2004 | Hack et al. |
| 2004/0061107 A1 | 4/2004 | Duggal |
| 2004/0174116 A1 | 9/2004 | Lu et al. |
| 2005/0242717 A1 | 11/2005 | Bae et al. |
| 2005/0243029 A1* | 11/2005 | Kang .................. G09G 3/22 345/74.1 |
| 2006/0033426 A1 | 2/2006 | Chao et al. |
| 2006/0082527 A1* | 4/2006 | Ogawa .................. G09G 3/2014 345/82 |
| 2007/0063946 A1 | 3/2007 | Nakamura et al. |
| 2007/0205423 A1 | 9/2007 | Yamazaki et al. |
| 2007/0257944 A1 | 11/2007 | Miller et al. |
| 2007/0279372 A1 | 12/2007 | Brown Elliott et al. |
| 2008/0180365 A1* | 7/2008 | Ozaki .................. G09G 3/3233 345/76 |
| 2008/0198180 A1 | 8/2008 | Langendijk |
| 2008/0203905 A1 | 8/2008 | Je et al. |
| 2009/0085478 A1 | 4/2009 | Cok et al. |
| 2009/0092325 A1 | 4/2009 | Brown Elliott et al. |
| 2009/0109172 A1 | 4/2009 | Lee et al. |
| 2009/0121945 A1 | 5/2009 | Sung et al. |
| 2009/0189881 A1 | 7/2009 | Ooishi et al. |
| 2009/0273616 A1 | 11/2009 | Loebl |
| 2009/0295283 A1 | 12/2009 | Kim et al. |
| 2009/0322802 A1* | 12/2009 | Noguchi .............. G09G 3/2003 345/694 |
| 2010/0033980 A1 | 2/2010 | Vogel et al. |
| 2010/0053137 A1* | 3/2010 | Park .................. G09G 3/3225 345/211 |
| 2010/0090620 A1 | 4/2010 | Hack et al. |
| 2010/0103187 A1 | 4/2010 | Linssen |
| 2010/0187988 A1 | 7/2010 | Forrest et al. |
| 2010/0219427 A1 | 9/2010 | Fukuda |
| 2010/0231484 A1 | 9/2010 | Cok et al. |
| 2010/0244069 A1 | 9/2010 | Weaver |
| 2011/0062427 A1 | 3/2011 | Jeong et al. |
| 2011/0085068 A1 | 4/2011 | Ito et al. |
| 2011/0095276 A1 | 4/2011 | Imai et al. |
| 2011/0096530 A1 | 4/2011 | Shimizu et al. |
| 2011/0233600 A1 | 9/2011 | Lin et al. |
| 2011/0248294 A1 | 10/2011 | Weaver et al. |
| 2011/0261303 A1 | 10/2011 | Jang et al. |
| 2011/0309389 A1 | 12/2011 | Yu et al. |
| 2012/0026210 A1 | 2/2012 | Yano et al. |
| 2012/0075278 A1 | 3/2012 | Hara et al. |
| 2012/0147065 A1 | 6/2012 | Byun et al. |
| 2012/0205620 A1 | 8/2012 | Sato et al. |
| 2012/0224146 A1 | 9/2012 | Katou |
| 2012/0287605 A1 | 11/2012 | Chen et al. |
| 2013/0020933 A1 | 1/2013 | Levermore et al. |
| 2013/0082589 A1 | 4/2013 | So et al. |
| 2013/0105777 A1 | 5/2013 | Adamovich |
| 2013/0105778 A1 | 5/2013 | Kim et al. |
| 2013/0105833 A1 | 5/2013 | Weaver et al. |
| 2013/0146904 A1 | 6/2013 | Edmond et al. |
| 2013/0161595 A1* | 6/2013 | Kim .................. H01L 27/3216 257/40 |
| 2013/0187132 A1 | 7/2013 | Ando et al. |
| 2013/0235094 A1 | 9/2013 | Cok |
| 2013/0285537 A1 | 10/2013 | Chaji |
| 2014/0061595 A1 | 3/2014 | Kim et al. |
| 2014/0065750 A1 | 3/2014 | Mohan et al. |
| 2014/0084256 A1 | 3/2014 | Kim et al. |
| 2014/0111406 A1 | 4/2014 | Wang et al. |
| 2014/0159067 A1 | 6/2014 | Sakariya et al. |
| 2014/0183471 A1 | 7/2014 | Heo |
| 2014/0203244 A1 | 7/2014 | Hack et al. |
| 2014/0209888 A1 | 7/2014 | Hack et al. |
| 2014/0327709 A1 | 11/2014 | Hack et al. |
| 2014/0374696 A1 | 12/2014 | Liu et al. |
| 2015/0009194 A1 | 1/2015 | Kim et al. |
| 2015/0034911 A1 | 2/2015 | Liu et al. |
| 2015/0084054 A1 | 3/2015 | Fan et al. |
| 2015/0092137 A1 | 4/2015 | Kim et al. |
| 2015/0171374 A1 | 6/2015 | Burrows et al. |
| 2015/0340410 A1 | 11/2015 | Hack et al. |
| 2015/0349034 A1 | 12/2015 | Hack et al. |
| 2015/0371585 A1 | 12/2015 | Bower et al. |
| 2016/0064363 A1 | 3/2016 | Bower et al. |
| 2016/0233274 A1 | 8/2016 | Park |
| 2017/0022963 A1 | 1/2017 | DeBenedictis |

FOREIGN PATENT DOCUMENTS

| | | |
|---|---|---|
| JP | 2010050014 A | 3/2010 |
| JP | 2010165510 A | 7/2010 |
| JP | 2012077069 A | 4/2012 |
| JP | 2012089513 A | 5/2012 |
| JP | 2012109576 A | 6/2012 |
| WO | WO-2006115960 A1 | 11/2006 |
| WO | WO-2008057394 A1 | 5/2008 |
| WO | WO-2010011390 A2 | 1/2010 |
| WO | WO-2014020817 A1 | 2/2014 |

OTHER PUBLICATIONS

Baldo, et al., "Very high-efficiency green organic light-emitting devices based on electrophosphorescence", Applied bhysics Letters, vol. 75, No. 1, pp. 4-6, Jul. 5, 1999.

Dyble, et al., "Impact of Dimming White LEDs: Chromaticity Shifts Due to Different Dimming Methods", 5th Int'l Conf. on Solid State Lighting, Proceedings of SPIE 5941, 291-299 Bellingham WA Int'l Society of Optical Engineers 2005.

Hack, et al., "Novel Two Mask AMOLED Display Architecture", SID 2014 Digest; pp. 567-569.

Han, Chang-Wook, "Invited Paper: 15-inch RGBW Panel Using Two-Stacked White OLED and Color Filter for Large-Sized Display Applications".

International Search Report and Written Opinion dated Nov. 10, 2015 in corresponding International Application No. PCT/US2015/032672., Nov. 10, 2015.

Kim, et al., "Highly enhanced light extraction from organic light emitting diodes with little image blurring and good color stability", Organic Electronics 17, 2015, 115-120.

Kim, Kichan et al., "a-IGZO TFT Based Operational Amplifier and Comparator Circuits for the Adaptive DC-DC Converter", SID 2014

(56) References Cited

OTHER PUBLICATIONS

Digest, MEMs Display and Sensor Lab., School of Elec Engineering Soongsil University Seoul Korea pp. 1164-1167.
"LED peak-wavelength shift", Rensselaer Polytechnic Institute, 2015, 1 page.
Li, Phengui, "Evaporative Self-Assembly of Gold Nanorods into Macroscopic 3D Plasmonic Superlattice Arrays" avail, in Adv. Materials V. 28, Iss. 13 (p. 2511-2517).
Martin, B. Cao, "A comparative study of hillock formation in aluminum films", received Dec. 2, 1994 vol. 271 Issue 1-2 (p. 64-68).
Nikolov, "Samsung Galaxy S6 review-a bunch of innovs. In a beaut. body", laptopmedia.com/reviews/samsung-galaxy-s6-review-a-bunch-of-innovations-in-a-beautiful-body Mar. 25, 2015.
Niu, Xiaobin, "The Smallest Metallic Nanorods Using Physical Vapor Deposition" vol. 110 Issue 13.
Office Action dated Apr. 14, 2017 as received in CN Application No. 201410019395.X.
Office Action dated Feb. 14, 2017 as received in JP Application No. 2014-005666.
Office Action dated Jul. 11, 2017 as received in JP Application No. 2014-005666.
Shao, Lei, "Comparison of the plasmonic performances between lithographically fabricated and chemically grown gold nanorods" vol. 17, Issue 16.
Wood, "MacAdam Ellipses", Protocol, 2010, 15-18.

\* cited by examiner

5" display, at 700 cd/m², 44% polarizer, 50% pixels on

HYBRID DISPLAY

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to devices, such as full-color displays, which include both OLEDs and inorganic light emitting diodes or devices (LEDs), and other devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels Color may be measured using CIE coordinates, which are well known to the art.

One example of a green emissive molecule is tris(2-phenylpyridine) iridium, denoted Ir(ppy)$_3$, which has the following structure.

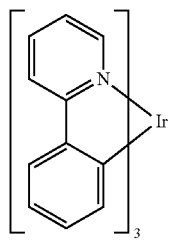

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive component that is described as producing a specific color of light may include one or more emissive layers disposed over each other in a stack.

As used herein, a "red" layer, material, region, or device refers to one that emits light in the range of about 580-700 nm; a "green" layer, material, region, or device refers to one that has an emission spectrum with a peak wavelength in the range of about 500-600 nm, a "blue" layer, material, or device refers to one that has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general there are two classes of color altering layers: color filters that modify a spectrum by removing unwanted wavelengths of light, and color changing layers that convert photons of higher energy to lower energy. Alternatively or in addition, a specific-color emissive component may be described as having a "dominant spectral distribution" of the specific color. For example, a "red sub-pixel" may emit light having a dominant spectral distribution of red light. Generally, when an emissive layer, region, sub-pixel, or other component is described herein as emitting "a color," such description refers to a single color such as red, green, light blue, deep blue, yellow, or the like, excluding white. A "white" emissive component typically is formed from multiple single-color components that are not individually addressable, i.e., that always operate in tandem to produce white light.

More details on OLEDs, and the definitions described above, can be found in U.S. Pat. No. 7,279,704, which is incorporated herein by reference in its entirety.

SUMMARY OF THE INVENTION

According to an embodiment, a pixel arrangement comprises a first sub-pixel configured to emit a first color, the first sub-pixel comprising an inorganic light-emitting diode (LED), which may be a micro-LED; a second sub-pixel configured to emit a second color, the second sub-pixel comprising a first portion of a first organic emissive stack configured to emit an initial color different from the first color; and a third sub-pixel configured to emit a third color different from the initial color. The third sub-pixel may include a second portion of the first organic emissive stack and a first color altering layer disposed in a stack with the second portion of the first organic emissive stack. The second color may be the initial color, such as yellow. The first color may be blue.

The first organic emissive stack may include a single organic emissive layer, or may include multiple organic emissive layers. Each layer may include one or more emissive materials that emits light of the same or different colors. The arrangement may include LEDs of only the first color. The first sub-pixel may include a plurality of LEDs configured to emit the first color, which may be connected in series, parallel, or combinations thereof.

The LED may be disposed in a stack with a third portion of the first organic emissive stack, such as where the organic emissive stack is an unpatterned stack.

The arrangement may include a fourth sub-pixel configured to emit a fourth color different from the initial color, where the fourth sub-pixel includes a third portion of the first organic emissive stack; and a second color altering layer disposed in a stack with the third portion of the first organic emissive stack.

The pixel arrangement may include a plurality of pixels, each of which includes sub-pixels of at least three colors, at least four colors, or more. Each sub-pixel containing one or more LEDs may be a sub-pixel of at least two of the plurality of pixels, i.e., the sub-pixel may be shared among multiple pixels. The resolution of sub-pixels containing the LEDs in the arrangement may be less than the pixel resolution of the arrangement.

The arrangement may include one or more backplanes, each of which may be passive- or active-matrix. A first backplane may be configured to drive the first sub-pixel, and/or each of the second and third sub-pixels, or a second backplane may be configured to drive each of the second and third sub-pixels.

The first sub-pixel may be disposed on a first substrate, and each of the second and third sub-pixels on a second substrate. The first substrate may provide a protective lid for each of the second and third sub-pixels. One or both of the substrates may be transparent and/or flexible.

At least one of the first sub-pixel and the second sub-pixels may include a top-emitting OLED or a bottom-emitting OLED that includes the first portion of the first organic emissive stack.

In an embodiment, a pixel arrangement for a light emitting device includes a first sub-pixel configured to emit a first color, which includes a plurality of inorganic LEDs electrically connected to one another in parallel; and a second sub-pixel configured to emit a second color, different from the first color, which includes an OLED.

In an embodiment, a lighting device includes a plurality of blue inorganic LEDs disposed in a region that defines a first plane; and an unpatterned yellow organic emissive stack disposed in a second plane parallel to the first plane. The yellow organic emissive stack may be transparent, and blue light generated by the inorganic LEDs may be transmitted through the yellow organic emissive stack during operation of the device.

In an embodiment, a pixel arrangement for a full-color display is provided, which includes a first sub-pixel configured to emit a first color, the first sub-pixel comprising an inorganic light-emitting diode (LED), a second sub-pixel configured to emit a second color, the second sub-pixel comprising a first portion of a first organic emissive stack configured to emit an initial color different from the first color; and a single data driver configured to provide luminance information to each of the first sub-pixel and the second sub-pixel.

In an embodiment, a hybrid display is provided that includes pixels formed form, or including, an inorganic blue LED, a green OLED having first CIE coordinates, a red OLED having second CIE coordinates, and a yellow OLED having CIE coordinates that lie to the right of a line between the first CIE coordinates and the second CIE coordinates on the 1931 CIE color chart. Specific combinations of sub-pixel colors may be used. For example, the yellow OLED may have a dominant spectral distribution in the range of 55 nm-580 nm, the green OLED may have a dominant spectral distribution in the range of 510 nm-525 nm, the blue LED may have a dominant spectral distribution in the range of 450 nm-455 nm, and/or the red OLED may have a dominant spectral distribution in the range of 620 nm-625 nm.

In an embodiment, a method of correcting operation of a full-color hybrid display comprising inorganic LEDs and OLEDs is provided, which includes identifying a first LED in the display that is nonfunctional, selecting a plurality of emitting components in the display within the same pixel or an adjacent pixel as the first LED, and operating the plurality of emitting components at an increased luminance, the increased luminance being sufficient to compensate for luminance that would be provided by the first LED if it was functional. The emitting components may be OLEDs, such as red, green, and/or yellow OLEDs in the display, and/or they may include other inorganic LEDs such as blue LEDs. Multiple emitting components, such as several OLEDs in the region of the first LED, may be used.

In an embodiment, a hybrid display is provided that includes pixels having at least one inorganic LED sub-pixel and at least one OLED sub-pixel. The display may include not more than one blue sub-pixel for every 16 pixels in the display.

In an embodiment, a hybrid display is provided that includes pixels having at least one inorganic LED sub-pixel and at least one OLED sub-pixel. The active area of the inorganic LED may be at least 25% of the active area of a single pixel of the display.

In an embodiment, a hybrid display is provided that includes a substrate and multiple pixels disposed over the substrate, each of which includes a red sub-pixel having a red organic emissive layer, a green sub-pixel having a green organic emissive layer and disposed adjacent to, and non-overlapping with, the red emissive layer, and an inorganic blue LED sub-pixel disposed in a plane above or below the red and green sub-pixels. The red and green emissive layers may be arranged in a geometry corresponding to a deposition mask having a resolution of not more than one-half of the display resolution. Each blue LED sub-pixel may be shared among multiple pixels; for example, each blue sub-pixel may be shared among up to 64 pixels.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
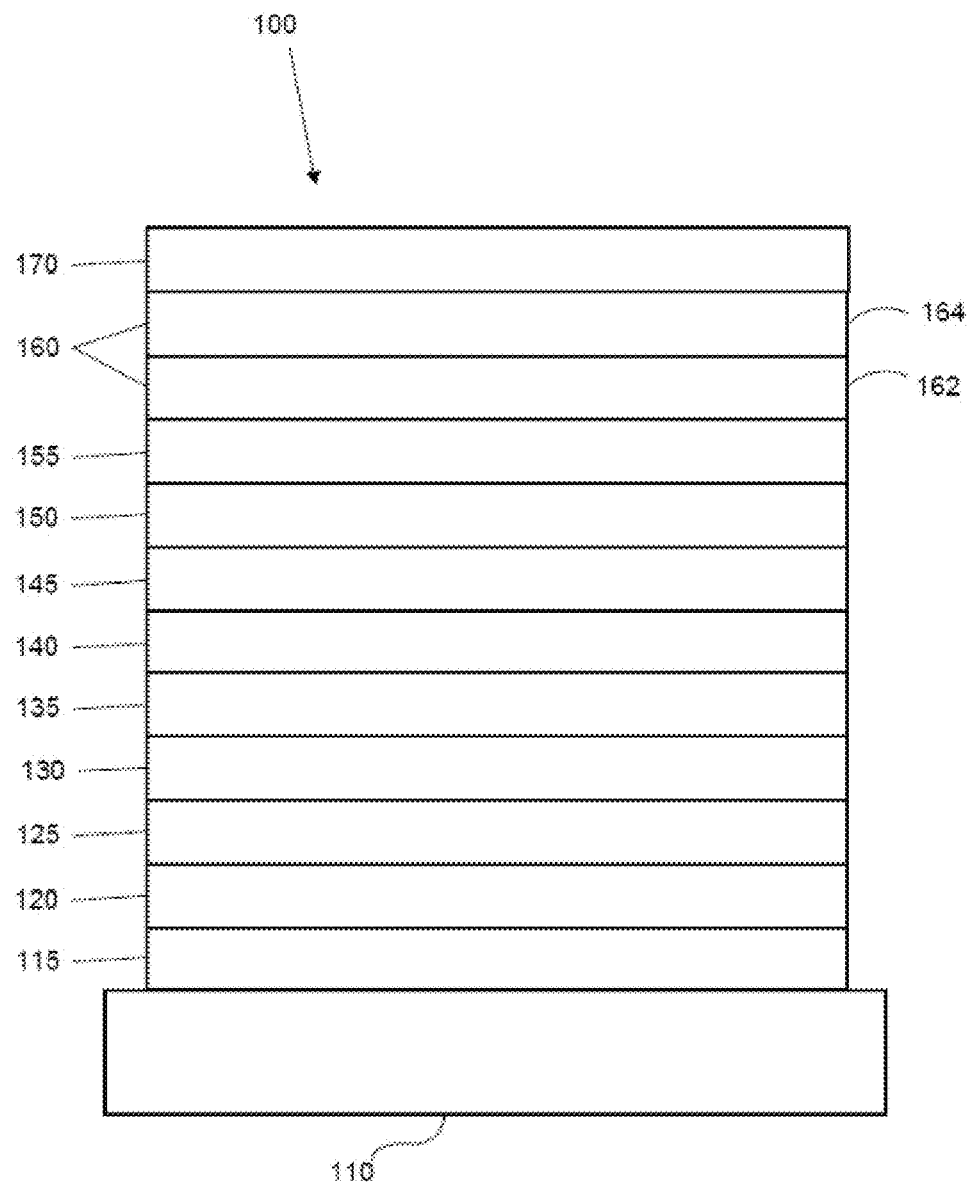
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
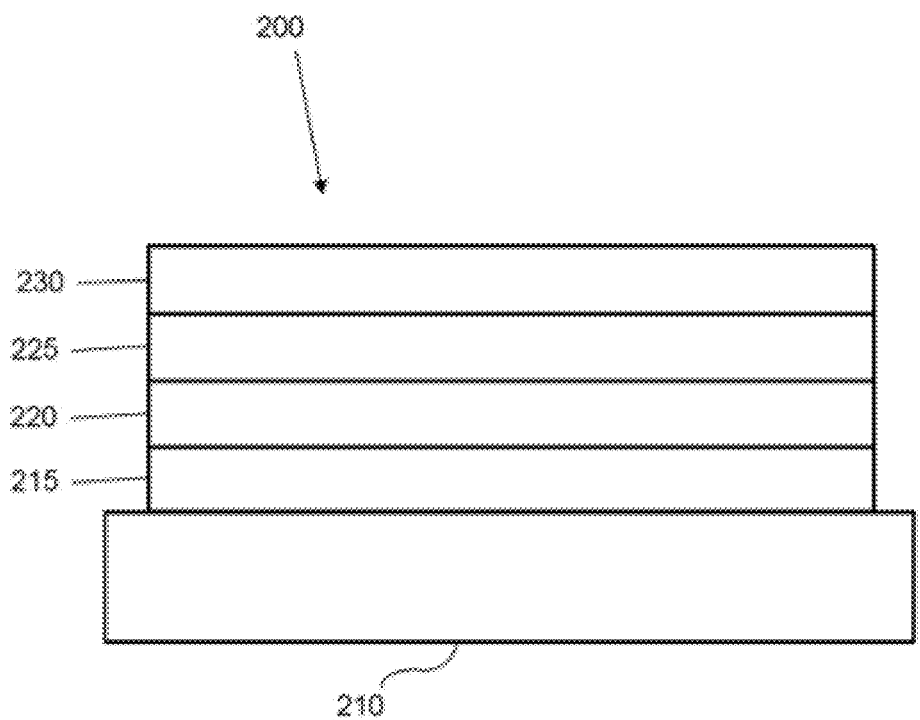
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

When used in a device such as a display, it may be convenient to refer to an emissive stack of an OLED), in comparison to or in conjunction with a pixel or sub-pixel of the device. For example, an OLED stack may be used as the component that generates the initial light that ultimately will be emitted by a pixel or a sub-pixel. Generally, a "sub-pixel" is a smallest addressable emissive region in a device such as a full-color display. A "pixel" generally includes multiple sub-pixels such that, during operation of a display, some or all sub-pixels within the pixel are driven to produce one overall resultant color. In some cases, each pixel may be a "full-color pixel," that is, one that includes sub-pixels of each primary color of a particular rendering scheme (such as red/green/blue, red/green/blue/yellow, or the like), which can be treated as the smallest addressable imaging element, and generally is capable of producing white light. In another type of configuration, individual sub-pixels may be included in rendering calculations using techniques typically referred to as sub-pixel rendering. Such techniques may require more extensive analysis and processing time, but may produce superior images in some cases. Sub-pixel rendering typically uses information about the particular pixel and sub-pixel geometry of a display to manipulate sub-pixels separately, thereby producing an increase in the apparent resolution of color displays. In such a device, each "pixel" within the display may not be identical to each other pixel within the same display, since each pixel may include different sub-pixel colors and/or geometries. Regardless of whether full-color pixels or sub-pixel rendering configurations and techniques are used, an individual sub-pixel may be distinguished from OLED stack contained within the sub-pixel as disclosed herein.

A sub-pixel may include, or may be used in conjunction with, one or more color altering layers that alter the initial light generated by an OLED stack in the sub-pixel. For example, a pixel may include red, green, and blue sub-pixels. The green sub-pixel may include a yellow OLED coupled to a green color altering layer, i.e., one that alters the initial yellow light generated by the OLED to green light that is ultimately emitted by the sub-pixel.

Within the OLED, an emissive stack generates the initial light, as disclosed with respect to the emissive layers (EMLs) shown in FIGS. 1-2. An emissive stack may include one or more emissive layers, as disclosed with respect to FIGS. 1-2. In some configurations an emissive stack may include multiple individual layers of the same or different colors, or a mixed layer that generates more than one color. Thus, each layer may be described as generating its respective color of light, while the stack as a whole may be described as generating the same or a different color of light than some or all of the emissive layers within the stack.

In some configurations, an "emissive stack" may include emissive materials that emit light of multiple colors. For example, a yellow emissive stack may include multiple materials that emit red and green light when each material is used in an OLED device alone. When used in a yellow device, the individual materials typically are not arranged such that they can be individually activated or addressed. That is, the "yellow" OLED stack containing the materials cannot be driven to produce red, green, or yellow light; rather, the stack can be driven as a whole to produce yellow light. Such a configuration may be referred to as a yellow emissive stack even though, at the level of individual emitters, yellow light is not directly produced. Individual emissive materials used in an emissive layer or stack (if more than one), may be placed in the same emissive layer within the device, or in multiple emissive layers within an OLED. As previously indicated, in some configurations, the final color emitted by an activated sub-pixel may be the same as the color provided by the emissive material in the stack that defines the sub-pixel, such as where a deep blue color altering layer is disposed in a stack with a light blue emissive stack to produce a deep blue sub-pixel. Similarly, the color provided by a sub-pixel may be different than the color provided by an emissive material in the stack that defines the sub-pixel, such as where a green color altering layer is disposed in a stack with a yellow emissive stack to product a green sub-pixel. As used herein, the term "emissive stack" or "OLED stack" refers only to the layers necessary initially to generate light in an OLED arrangement as described with respect to FIGS. 1-2, such as electrodes, emissive layers, transport layers, blocking layers, and the like, and excludes color altering layers such as color filters, color change layers, and the like. It also excludes layers such as protective films, single-layer barriers, and the like. As a specific example, a simple OLED stack includes an anode, a cathode, and a layer of organic emissive material disposed between the anode and the cathode. A corresponding subpixel may include only the OLED stack, where the sub-pixel is intended to emit the same color of light as the light generated by the organic emissive material, or it may also include a color altering layer such as a color filter, when the sub-pixel is intended to emit a different color of light from that generated by the organic emissive layer. An OLED stack also may include multiple layers that could individually be considered separate OLED stacks, such as where one or more charge generation layers (CGLs) is disposed between an anode and a cathode, with a layer of organic emissive material disposed between the anode and the CGL, and a layer of another organic emissive material disposed between the cathode and the CGL. In such a configuration, the entire stack including the anode, cathode, CGL, and both layers of organic emissive material may be considered a single OLED stack. An OLED stack may be patterned or unpatterned, depending upon whether the organic emissive layer or layers within the stack are patterned or unpatterned at the pixel or sub-pixel level. That is, a "patterned OLED stack" is one in which one or more emissive layers within the stack have a pattern, such as a repeating arrangement of regions of emissive material that are separated by another material. An "unpatterned OLED stack" refers to an OLED stack in which the relevant emissive layer or layers do not have such a pattern, such as, for example, an emissive layer that is a uniform, continuous layer within the stack. Whether an OLED stack is considered patterned or unpatterned is determined only by the patterning or lack thereof of the emissive layer or layers in the stack at a pixel or sub-pixel level, without regard to whether one or more electrodes or charge generation layers within the stack are patterned.

In some configurations, emissive layers and/or stacks may span multiple sub-pixels within the same device, such as where additional layers and circuitry are fabricated to allow portions of an emissive layer or stack to be separately addressable.

An emissive stack as disclosed herein may be distinguished from an individual emissive "layer" as typically referred to in the art and as used herein. In some cases, a single emissive stack may include multiple layers, such as where a yellow emissive stack is fabricated by sequentially red and green emissive layers to form the yellow emissive stack. As previously described, when such layers occur in an emissive stack as disclosed herein, the layers are not individually addressable; rather, the layers are activated or driven concurrently to produce the desired color of light for the emissive stack. In other configurations, an emissive stack may include a single emissive layer of a single color, or multiple emissive layers of the same color, in which case the color of the emissive stack will be the same as, or in the same region of the spectrum as, the color of the emissive layer. In some cases a "stacked" device, i.e., one including multiple sets of layers that each could be considered a separate OLED device, may be arranged and controlled such that each individual stack within the overall stack may be separately addressable. Such configurations are disclosed in further detail in U.S. Pat. Nos. 8,827,488 and 5,707,745, the disclosure of each of which is incorporated by reference in its entirety.

In contrast to OLEDs, inorganic or conventional light-emitting diodes (LEDs) have different advantages and disadvantages. For example LEDs often may be operated at a higher luminance than OLEDs, and may be more efficient at generating blue light, or can produce blue light efficiently with a longer lifetime. However, OLEDs typically have a greater efficiency roll-off with increasing luminance, wider spectral line widths for similar emission colors, and may be used with a wider range of substrates. Recent technical advances allow for micro-LEDs to be fabricated efficiently and accurately placed at pre-determined positions on a substrate, making them suitable for use as sub-pixels in pixel-based devices such as full-color displays. As disclosed herein, combining micro-LEDs with OLEDs may allow for displays with improved performance and attributes compared to a similar device than uses either technology independently. For example, many current OLED display arrangements have fabrication issues related to patterning technologies, such as particulate and scaling issues when using fine metal masks for deposition, or efficiency and lifetime issues when using white OLEDs in conjunction with color filters. As another example, current deep blue OLEDs may have unsatisfactory lifetime.

Micro-LED attachment is under ongoing development, but there are two significant issues in developing an all micro-LED display. First, the typical yield for micro-LEDs may be insufficient to support full-color display fabrication. Displays typically require near perfect sub-pixel yield, so any shorted or open micro-LEDs would be very problematic. The second relates to the achievable grey scale of an all micro-LED display. Micro-LEDs, in particular green micro-LEDs, typically color shift as they are dimmed, whether by analog or pulse width modulation driving schemes, and red micro-LED color output is very temperature dependent. As a result, an all micro-LED display would be expected to have relatively very poor color accuracy with grey scale. The only pure micro-LED displays currently in use are large-scale devices such as billboards or video walls, which are not appreciably affected by these issues.

As a result, it has been determined that a combination of micro-LEDs and emissive OLED stacks may provide an efficient and versatile hybrid display pixel arrangement. According to an embodiment, a hybrid pixel arrangement may include a first sub-pixel that emits a first color using an inorganic LED. A second sub-pixel emitting a second, different color, may use an organic stack that generates an initial color. The second sub-pixel may be unfiltered, i.e., it may ultimately emit the same color as the light generated by the OLED stack, or it may include a color altering layer. A third sub-pixel may use the same emissive stack, and may also use a color altering layer such that the sub-pixel emits a different color than either of the other sub-pixels. The LED may be a micro-LED, i.e., one having dimensions on the micrometer scale, such as a width of about 1-50 μm, which may be suitable for relatively small applications such as mobile devices, televisions, and the like. In some embodiments the LED may be larger, such as may be suitable for larger applications such as signs and the like. A micro-LED may have various shapes, including square, diamond, rectangular, or other shapes. As used herein, an "LED" may refer to a micro-LED, a mini-LED, or a larger LED, as appropriate for the context or application in which the LED is used.

More specifically, as disclosed herein the use of blue LEDs with red and green OLEDs may provide a viable full-color display with relatively low power consumption and relatively high luminance, lifetime, yield, color accuracy and optical performance. As a specific example, as disclosed herein a combination of blue LEDs and yellow OLEDs may allow for relatively simple and inexpensive fabrication while maintaining a high range of color.

Further, the use of LEDs in conjunction with OLEDs allows for improved physical arrangements and fabrication techniques as disclosed herein. For example, an unpatterned yellow OLED may be placed over one or more blue LEDs.

Color filters can then be used to form green and red sub-pixels, resulting in a "RGBY" (red, green, blue, yellow) display. Preferred arrangements may share one blue LED amongst multiple pixels, typically four pixels, allowing for LED redundancy and LED placement resolution lower than the overall display resolution, in some cases half the display resolution or less, thereby overcoming or avoiding manufacturing issues with accurate placement of the LEDs. Lowering the yield requirements for the LEDs through redundancy and the use of only one LED color may greatly ease manufacturability. The use of unpatterned OLED depositions, such as an unpatterned yellow stack, may allow for a relatively high fill factor and the potential to fabricate a stacked OLED architecture to further improve lifetime and display efficiency by reducing power consumption. Moreover, the relatively small area allocated to the blue LED sub-pixel may allow for light and deep red and green sub-pixels enabling very high color saturation, without incurring higher power requirements compared to a conventional OLED or LED display.

The OLED stack may include a single emissive layer, or it may be a tandem or other stacked structure. The use of a tandem structure may increase the display lifetime by an approximate factor of three, and also further decrease power consumption as described in further detail below. Stacking emissive layers of multiple colors is relatively difficult to implement in a conventional RGB side by side displays, as it requires multiple deposition chambers and non-common layer OLED structures. According to embodiments disclosed herein, OLED stacks that include multiple emissive layers may have yellow emissive materials in multiple emissive layers or, for example, a red emissive material in one layer and a green emissive material in another layer in the yellow OLED stack. The advantage of using stacked red and green emissive layers within a common yellow OLED stack to render red, green, and yellow sub-pixels include a greater realized color gamut than in a similar arrangement in which a single yellow emitter is used to render yellow. Alternatively or in addition, a yellow OLED stack may include yellow and red emissive layers. More generally, multiple emissive materials may be used in one or more emissive layers within an unpatterned emissive stack as disclosed herein.

In an embodiment, a hybrid display includes pixels having both inorganic LED and OLED sub-pixels. For example, a blue sub-pixel may be provided by one or more blue LEDs, and the remaining colors provided by one or more OLED sub-pixels. As a more specific example, an unpatterned yellow OLED stack in conjunction with red and green color altering layers may be used to provide red, green, and/or yellow sub-pixels. As used herein, a color altering layer refers to a structure such as a color filter, color altering layer, or color change layer, which alters the color of light transmitted through the layer. Color altering layers do not generate initial light; rather, they merely alter the wavelength or peak wavelength of light that is incident on the layer as it is transmitted through the layer. As another example, red, green, and/or yellow sub-pixels may be patterned using OVJP, ink jet printing, LITI, or other direct patterning processes known for fabrication of OLEDs. If patterning techniques are used, then red and green OLEDs may be fabricated in a side by side architecture, allowing for a three-color RGB hybrid display.

Figure 3A:
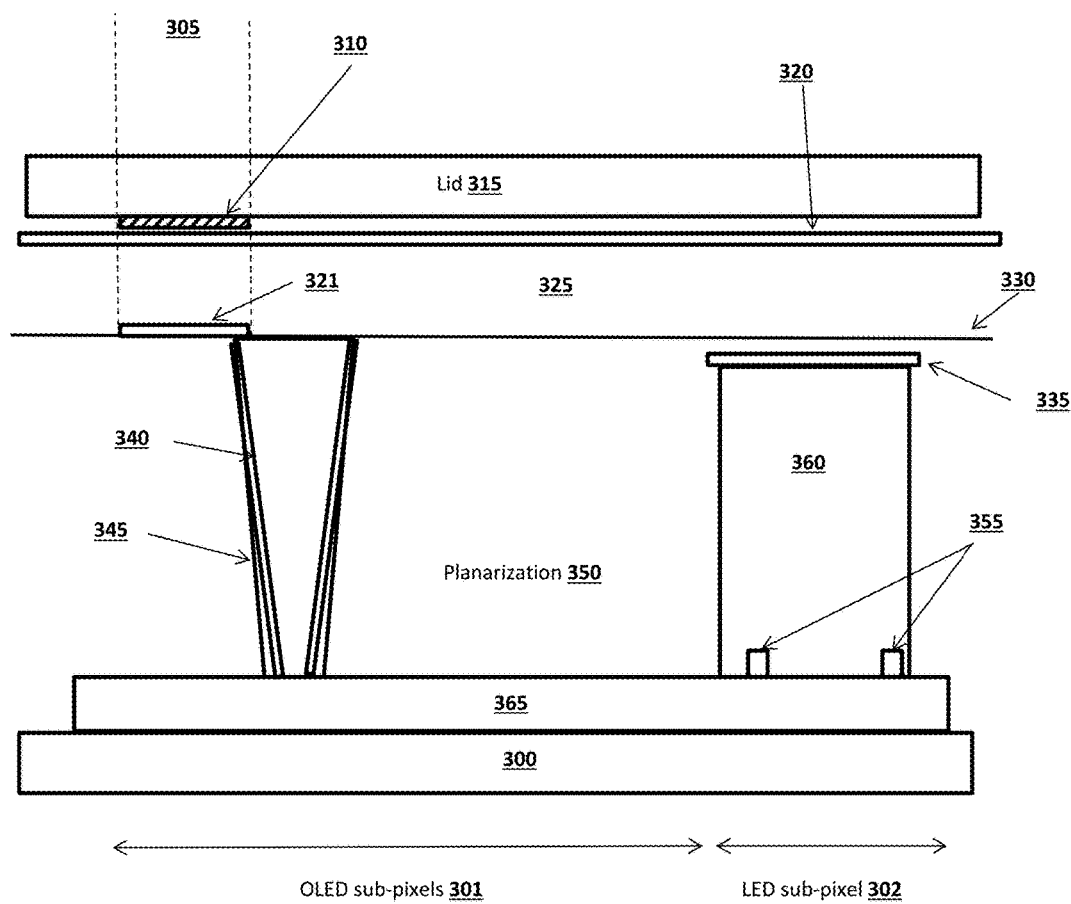
FIG. 3A shows a cross-sectional view of an example hybrid display in a top emission configuration as disclosed herein.

FIG. 3A shows a cross-sectional view of an example hybrid display in a top emission configuration as disclosed herein. Only one via is shown from the backplane to one OLED anode for illustration purposes, but it will be understood that other similar arrangements may be used for other OLED sub-pixels. As shown, an OLED sub-pixel 305 may be defined by an OLED anode 321, cathode 320, and a portion of an OLED stack 325. More generally, one or more OLED sub-pixels may be defined across a region 301 of a substrate 300, as described in further detail below. One or more inorganic LED sub-pixels also may be defined in a separate region 302. Although the example is shown using an unpatterned cathode 320 above an individual sub-pixel anode 321, it will be understood that other configurations, such as an unpatterned anode and individual cathodes, unpatterned layers separated by insulators or otherwise divided into individual sub-pixels, or the like may be used.

As previously described, the OLED stack 325 may include one or more emissive materials or layers, as well as other layers found in conventional OLED devices, such as those described with respect to FIGS. 1-2. The OLED stack 325 may be an unpatterned stack that is disposed in a stack with areas of the pixel shown in FIG. 3A that correspond to multiple sub-pixels. Multiple OLED sub-pixels may be defined by separate anodes, such as anode 321 that defines the sub-pixel 305. A color altering layer such as color filter 310 may be disposed in a stack with the anode 321. Alternatively, the color altering layer 310 may be omitted, resulting in an "unfiltered" OLED sub-pixel that will emit the same color of light as initially generated by the OLED stack 325. Sub-pixels that include a color altering layer 310 will emit a color of light determined by the color altering layer 310, which will be different than the color of light initially generated by the OLED stack 325. Using the arrangement shown in FIG. 3A, additional sub-pixels may be created by placing additional anodes adjacent to the anode 321 and in a separate stack from the anode 321, in a stack with a different portion of the OLED stack 325. For example, another anode placed adjacent to the anode 321 could be used to define an OLED sub-pixel that would emit the same color of light as the light generated by the OLED stack 325, presuming no color altering layer was disposed in a stack with the additional anode. If a second color altering layer was disposed in a stack with the additional anode and the second portion of the OLED stack 325, the additional sub-pixel would then emit light having the same color as light initially generated by the OLED stack 325.

As described in further detail herein, a TFT backplane 365 and other associated electrical structures may provide power to, and control of, the sub-pixels within a display via metal layers 340 disposed within channels 345 between the backplane 365 and the sub-pixels. Electrical connections 355 from the LED 360 to the backplane 365 may provide power and/or control of the LED 360.

A sub-pixel may include one or more inorganic LEDs 360. Typically no color altering layers are used in conjunction with the LED, so that the sub-pixel defined by the LED will emit the same color of light as the light initially generated by the LED, although in some embodiments a color altering layer may be used to modify the spectral output of the LED. As shown in FIG. 3A, the organic stack 325 may be disposed over or otherwise in a stack with the micro-LED. This may not substantially affect the color of light emitted by the LED sub-pixel, because the portion of the OLED stack 325 that is disposed in a stack with the LED may not be active and may not operate as a color altering layer with respect to light emitted by the LED 360. For example, the OLED stack 325 may be transparent, or substantially transparent with respect to the wavelength of light emitted by the LED 360. In some embodiments, the OLED stack may have a small impact on the color of the LED light passing through it even when the OLED stack may be considered transparent with respect to the light emitted by the LED, as it may have a transmission which varies with the wavelength of transmitted light.

The TFT 365 and associated circuitry may be formed on the substrate 300, which may be glass, metal or plastic. The substrate 300 may be flexible and/or encapsulated. OLED anode contacts such as anode 321 may then be formed using any suitable technique, such as those known for use with a conventional OLED display, including those previously disclosed herein.

The TFT backplane may be fabricated on, for example, low temperature plastics such as heat stabilized PEN, thus allowing for low temperature backplane technologies, such as OTFTs or oxide TFTs. Alternatively, the TFT be fabricated using LTPS on glass, polyimide or metal, or similar techniques.

Depending on the particular structure of the LED 360, the negative electrical connection to the LED may be provided by a common cathode also used for the OLED devices such as cathode 320, and so may be positioned above the LED devices as shown. Alternatively, the LED cathode may be incorporated into the TFT backplane 365, in which case under each LED there would be two power connections such as connections 355, with one being the conventional anode connection from the drive TFT, and the second being a common cathode connection that may be implemented by a common cathode connection running parallel to the rows or columns in the backplane in addition to providing a common cathode connection plane to the OLEDs. Such a configuration may be desirable because to connect a LED to the common OLED cathode may require a high feature to break the organic film continuity, so that the conducting cathode connects to the top of the LED. An example technique to accomplish such a configuration is for the thickness of a planarization layer 350 to be less than the height of the LED. More generally, the planarization 350 may be used to planarize the different heights resulting from use of a LED adjacent to and/or covered by an OLED stack 325 as shown in FIG. 3A. As another example, the electrical connections 355 for the LED 360 may be disposed on the top surface of the die, in which case the die may be attached to the backplane 365 and then the display planarized and vias 345 etched down to the backplane for all OLED and LED sub-pixels. The metalization 340 then may be deposited and patterned to connect the backplane 365 to the OLED anodes 321 through the vias 345, and also from the backplane to the non-common LED top connection. The LED common connections also may be connected by metal lines patterned at the same time.

In some embodiments, it may be desirable for reduced cost and manufacturing simplicity to use the same backplane, scan lines, data drivers and data lines to drive both OLED sub-pixels and LED sub-pixels. However, in conventional arrangements, both types of display elements are usually driven differently to achieve a desired gray scale. For OLEDs it is typical to adjust the device luminance based on current flowing through the OLED device. In contrast, LEDs typically use pulse width modulation (PWM) drive techniques so that while the LED is active it is held at a constant instantaneous luminance and junction temperature to maintain a constant color, and the percentage of time it is active determines the overall average sub-pixel luminance. Given that the analog drive scheme for OLED sub-pixels (with sub-pixel luminance proportional to current) is well understood and multi-TFT circuits are often used, it may be beneficial to use a similar circuit to implement PWM at the sub-pixel level, for example by using the same scan and data lines used by the OLED sub-pixels.

Figure 3B:
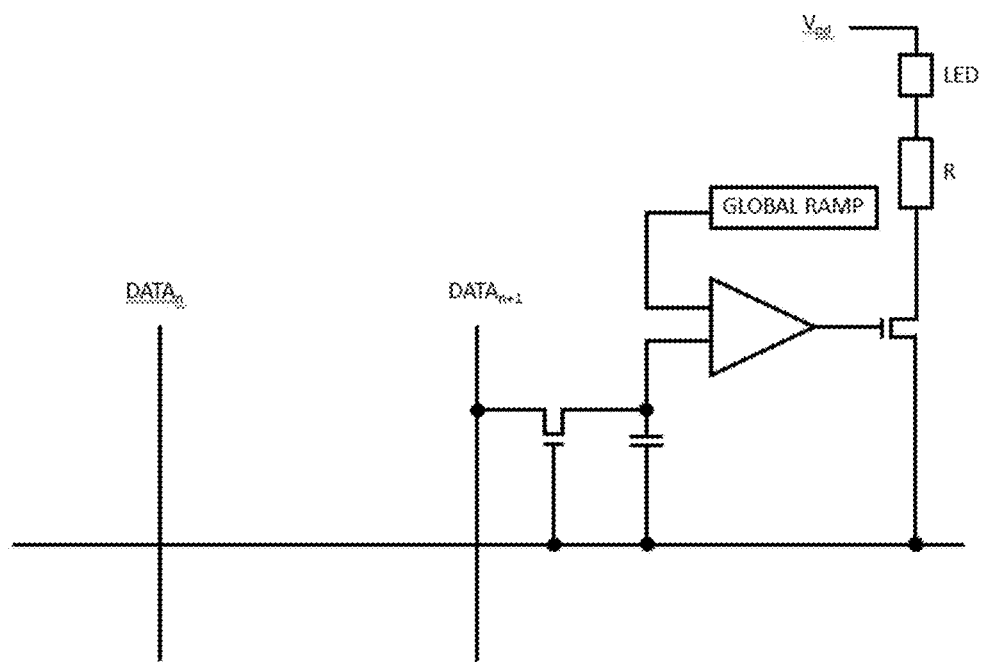
FIG. 3B shows an example pixel circuit to provide analog-type luminance control using pulse width modulation to drive an inorganic LED according to an embodiment disclosed herein.

Accordingly, in an embodiment PWM may be implemented by supplying a ramp voltage globally to each LED sub-pixel such that the ramp goes from minimum to maximum value in the time to address each scan line. FIG. 3B shows an example of a circuit according to such an embodiment. The data line can supply a voltage that corresponds to the required overall luminance of a sub-pixel that then will be converted into a period of time for which the LED will be driven at a constant current. This current may be set by a resistor with resistance R and a driver TFT saturation voltage $V_{sat}$ such that $$I_{LED}=(V_{dd}-V_{sat}-V_{LED})/R$$

The pulse width of the LED drive may be set by the comparator, as shown in the example circuit of FIG. 3B. The data voltage may be stored on the pixel capacitor, and the driver TFT will be energized when the data voltage is less than the instantaneous ramp voltage, and will turn off when the two voltages are equal. Accordingly, the pulse width will be determined by the slope of the ramp, which is fixed, and the data voltage for each sub-pixel. The various components shown in FIG. 3B, and as may be used in similar circuits as disclosed herein, may be fabricated using various techniques suitable for use with micro-LEDs and OLEDs. For example, a thin film comparator and operational amplifier has been demonstrated using IGZO TFTs, as described in Kichan Kim et al., "a-IGZO TFT Based Operational Amplifier and Comparator Circuits for the Adaptive DC-DC Converter," SID 2014 Digest, p. 1164 (2014).

As another example, in an embodiment the sub-pixel luminance may be controlled by transferring micro-silicon chips onto the display backplane, such that each chip controls multiple pixels. Such configurations have been demonstrated by Alien Technologies of San Jose, Calif. and Semprius Inc. of Durham, N.C. using a pick and place technology similar to that used by X-Celeprint of Cork, Ireland for micro-LED transfer. Each such chip may contain the circuitry for each sub-pixel it is to control. The output of the chip is connected to the respective LED in each sub-pixel. In some cases, one chip may control up to 16 sub-pixels. Such configurations would readily allow for implementation of a PWM drive circuit within the silicon chip.

As another example, using a typical TFT backplane with power constantly applied to the drive TFT and LED and/or OLED chain, PWM can be implemented by running the display at a higher frame rate than that required, and then use the sub-frames to achieve some form of digital luminance control. For example, if a display is operated at 480 Hz, but only 60 Hz is required for the video signal, there can be 8 sub-frames per frame, allowing for 8 grey levels, which can be combined with analog control. Examples of control schemes suitable for use with embodiments disclosed herein, including those having more than three colors of sub-pixels, are provided in U.S. Application Pub. No. 2015/0349034, the disclosure of which is incorporated by reference in its entirety.

Notably, regardless of the specific configuration or arrangement used, such embodiments may provide for the same data driver or drive configuration to provide luminance data to both OLEDs and LEDs in hybrid embodiments disclosed herein. This may simplify the complexity of the drive circuitry, thereby reducing or minimizing the complexity that would otherwise be expected for such devices.

Figure 3C:
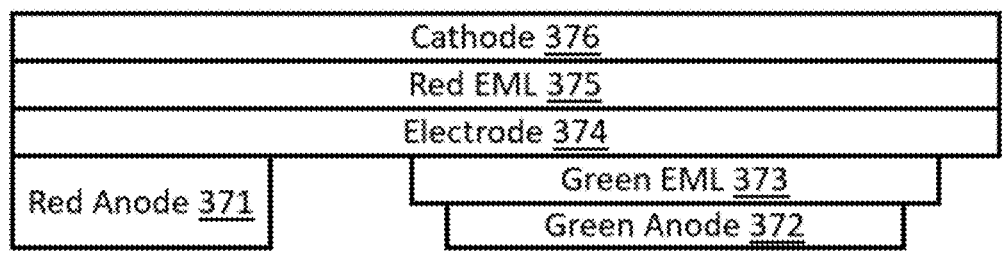
FIG. 3C shows an example arrangement of patterned and continuous emissive layers according to embodiments disclosed herein.

In some embodiments, layouts and drive schemes may be used in which separate emissive layers are disposed within a common stack, but each is independently addressable at the pixel or sub-pixel level. For example, fabrication techniques, layouts, and drive schemes may be used that are similar to those disclosed in U.S. application Ser. No. 15/172,888, filed Jun. 3, 2016, now U.S. Pub. No. 2017/0352709 and/or U.S. application Ser. No. 15/658,752, filed Jul. 25, 2017, now U.S. Pub. No. 2018/0033839, the disclosure of each of which is incorporated by reference in its entirety. For example, U.S. application Ser. No. 15/172,888, describes the use of a single mask to pattern one of the OLED layers, as shown in FIG. 3C, with a second continuous OLED layer being deposited over the patterned layer or layers. Similarly, in embodiments disclosed herein, red and green emissive layers may be deposited in the same manner as the layers described in the '888 application, with blue light provided by inorganic LEDs. In some embodiments, each blue sub-pixel may be shared by many pixels.

An arrangement as shown in FIG. 3C may be fabricated, for example, by fabricating the various layers shown in order. First, patterned anodes 371, 372 may be fabricated using any suitable technique, including deposition techniques common for OLEDs. Such an arrangement may be suitable for a multiplexed approach as disclosed herein, in which there is only a single pixel circuit per pixel and two $V_{dd}$ connections. Next, a patterned emissive layer such as the green emissive layer 373 may be deposited over the associated anode 372, such as through a shadow mask or using OVJP or similar techniques. A middle electrode 374 may be deposited over the anode 371 and the green stack 372/373. Next a blanket red emissive layer 375 and a blanket cathode 376 may be deposited over the middle electrode 374.

Although FIG. 3C shows a patterned green emissive layer and a continuous red emissive layer, it will be understood that these arrangements may be switched, to use a continuous green emissive layer and a patterned red emissive layer. Such embodiments may be suitable for very high resolution applications, and may use the arrangements disclosed herein of only a single sub-pixel driving circuit per pixel, which is multiplexed using switched power connections.

As another example, in the '752 application, no masking at the pixel level is required. Similar techniques may be used according to embodiments disclosed herein, thus allowing for the inorganic LEDs to be placed below the OLED plane, and for a single blue LED to be used for multiple pixels, such as 4, 16 or 64 pixels. Various arrangements in which a single blue LED is used with multiple pixels are described in further detail herein, for example with reference to FIG. 7.

Arrangements such as shown in FIG. 3C may provide stacked OLED sub-pixel arrangements that can be fabricated relatively efficiently, yet are still individually addressable within the pixel. For example, a 50% duty cycle may be used to address each of the red and green sub-pixels shown in FIG. 3C, in which the anode/electrode 374, red EML 375, and cathode 376 stack is addressed for half of the duty cycle, and the green anode/EML/electrode 372/373/374 for the other half of the duty cycle.

In embodiments disclosed herein, one or more LEDs may be fabricated using micro-printing, such as using systems available from X-Celeprint, electrostatic pick-and-place, such as using systems and techniques available from Luxvue, or any other suitable technique. LEDs as disclosed herein may be surface emitting, typically having a Lambertian emission profile, or edge emitting with a relatively narrower emission profile.

In some embodiments, an insulator may be disposed in a stack over the LED to prevent the OLED stack from being illuminated by it contacting the LED anode connection or pad. For example, referring to the illustrative arrangement shown in FIG. 3A, an insulator 335 may be disposed over the LED 360.

In an embodiment, after the LEDs have been positioned and, if required, an insulator disposed over the LEDs, the substrate may be prepared for OLED deposition. Referring again to the example arrangement shown in FIG. 3A, LED devices may have a height of about 0.5 to 10 μm, so a planarization deposition 350, which may be transparent, may be applied prior to OLED deposition. The planarization 350 may be organic or inorganic. In some cases, the curing temperature available for the planarization may be limited by the choice of substrate and backplane technology. If the planarization layer would be expected to outgass and thereby degrade the lifetime of the OLED emissive stack, a permeation barrier 330 may be deposited. The permeation barrier 330 may be deposited after the planarization 350 instead of, for example, direct deposition over a plastic substrate. The thickness of the planarization 350 may be less than LED height, equal to it, or slightly larger than the LED height. The vias 345 may be introduced with subsequent fabrication of metallization 340 as previously described, so as to provide pads for OLED electrodes and electrical connection to the TFT backplane.

Various pixel layouts may be used with embodiments disclosed herein. In some cases, it may be preferred to use a layout with an unpatterned OLED emissive stack at the pixel level. That is, an unpatterned layer or layers may be deposited in a region to form the OLED stack, without using a fine metal mask or other technique to deposit individual OLED sub-pixels. Such a technique may avoid the complexities inherent in the use of a fine metal mask for vacuum deposited OLEDs, or, similarly, in ink jet and other patterning technologies for solution processed OLEDs. Alternatively or in addition, OLED sub-pixels may be deposited using OVJP as previously disclosed herein.

Furthermore, different shaped sub-pixels also may be used. For example, diamond sub-pixels may be used to provide a higher fill-factor and/or higher resolution display.

Figure 3D:
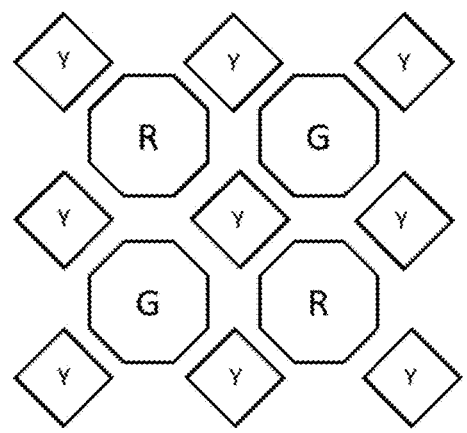
FIG. 3D shows an example pixel geometry and layout according to embodiments disclosed herein.

As another example, in some embodiments a pentile diamond sub-pixel arrangement may be used, as shown in FIG. 3D. This arrangement includes three OLED sub-pixels, configured to emit red, green, and yellow light. The red (R) and green (G) OLEDs may be larger than the yellow (Y) OLED and arranged in a repeating checkerboard or similar pattern across a display panel, with the yellow OLED sub-pixels disposed in interstitial positions between the red and green sub-pixels. Inorganic blue LEDs may be disposed on a different plane than the OLEDs, and configured to emit through the OLED layers and sub-pixels.

Such an arrangement is similar to conventional "Pentile" RGB OLED panels, except that the blue subpixels are not provided by OLEDs, and are not placed in the same plane as the OLEDs that provide the other sub-pixels. Notably, there are also twice as many yellow sub-pixels as red or green, thereby allowing for two additional modes of image reconstruction. One mode maps two sub-pixels per input pixel, i.e., each pixel specified by an input source may be mapped to, and thus displayed by, two sub-pixels. In another mode, one half of a sub-pixel is mapped per input pixel, i.e., each pixel specified by an input source is mapped to one-half of a sub-pixel in the display.

In a two sub-pixels per pixel mode, an input pixel is mapped to one and only one yellow subpixel and either a red or a green subpixel, using a sub-pixel rendering filter set. The red and green planes may use conventional "diamond" area resampling filters and sharpening filters. The yellow subpixel plane may be a unity filter or it may use a blurring filter plus a sharpening filter operating from a Luma plane.

The half sub-pixel per input pixel mode may take advantage of metamer exchange between yellow and the combined red and green sub-pixels. In other words, yellow output can be achieved by either energizing a yellow sub-pixel, or by using the red and green sub-pixels in conjunction to provide a yellow output light. Such an arrangement may enable a higher resolution, more specifically including resolution with less than one sub-pixel per input pixel, based on this metamer exchange.

Figure 3E:
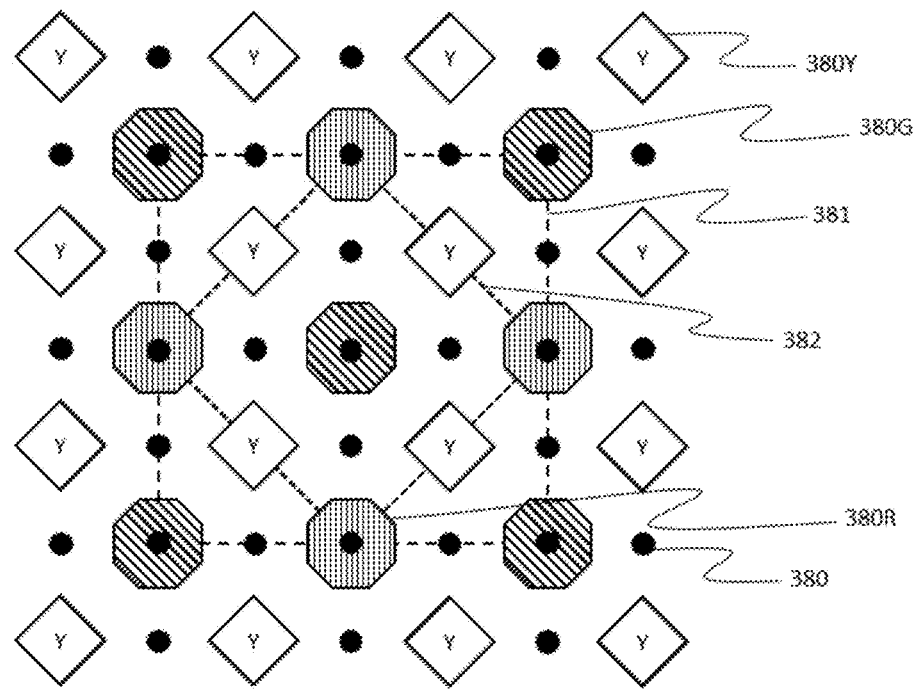
FIG. 3E shows an example pixel arrangement according to an embodiment disclosed herein.

In an embodiment, an approach to such a mapping is to map the input pixels such that the grid aligns with, and centers on half of the display subpixels. One of the challenges of the layout is that area resample sizes are not equal. For example, FIG. 3E shows an example pixel arrangement according to an embodiment disclosed herein. The arrangement shows red sub-pixels 380R, green sub-pixels 280G, and yellow (Y) sub-pixels 380Y as previously disclosed. Input pixels 380 are shown by solid dots. The yellow resample area 381 is shown by the dashed outline, and the red or green resample area 382 is shown by the dotted outline. The yellow sub-pixel resample area filter kernel is $$\begin{matrix} 1/16 & 2/16 & 2/16 \\ 2/16 & 4/16 & 2/16 \\ 1/16 & 2/16 & 1/16 \end{matrix}$$

and the red or green sub-pixel resample area filter kernel is $$\begin{matrix} & & 1/32 & & \\ & 2/32 & 4/32 & 2/32 & \\ 1/32 & 4/32 & 4/32 & 4/32 & 1/32 \\ & 2/32 & 4/32 & 2/32 & \\ & & 1/32 & & \end{matrix}$$

The use and derivation of filter kernels in the format as disclosed herein is understood in the art, for example as disclosed in U.S. Pat. No. 7,864,202. Another approach is to use two sharpening operations, one of which may be performed before sub-pixel rendering using metamer rendering with "virtual" yellow sub-pixels as previously disclosed.

A subpixel rendering operation according to such an embodiment may use conventional same-color sharpening. The metamer rendering filter may be generated by treating each yellow, red and green subpixels as all equal reconstruction points. For example, for the nine-input arrangement corresponding to the top-left of the yellow resample area 381 shown in FIG. 3E:

$$\begin{matrix} 0 & 2 & 0 \\ 2 & 8 & 2 \\ 0 & 2 & 0 \end{matrix} - \begin{matrix} 1 & 2 & 1 \\ 2 & 4 & 2 \\ 1 & 2 & 1 \end{matrix} = \begin{matrix} -1 & 0 & -1 \\ 0 & 4 & 0 \\ -1 & 0 & -1 \end{matrix}$$

The value of the filter is convolved with the Luma plane and is used to adjust the relative values of the yellow plane versus the red and green planes before subpixel rendering. The color sharpening filter derivation is shown below. This represents the yellow color sharpening filter, convolved with the Luma plane and added to the results of the area resample of the yellow plane:

$$\begin{matrix} 0 & 0 & 0 & 0 & 0 \\ 0 & 2 & 4 & 2 & 0 \\ 0 & 4 & 8 & 4 & 0 \\ 0 & 2 & 4 & 2 & 0 \\ 0 & 0 & 0 & 0 & 0 \end{matrix} - \begin{matrix} 0 & 0 & 1 & 0 & 0 \\ 0 & 2 & 4 & 2 & 0 \\ 1 & 4 & 4 & 4 & 1 \\ 0 & 2 & 4 & 2 & 0 \\ 0 & 0 & 1 & 0 & 0 \end{matrix} = \begin{matrix} 0 & 0 & -1 & 0 & 0 \\ 0 & 0 & 0 & 0 & 0 \\ -1 & 0 & 4 & 0 & -1 \\ 0 & 0 & 0 & 0 & 0 \\ 0 & 0 & -1 & 0 & 0 \end{matrix}$$

For sharpening the red and green sub-pixels, the filter may be convolved with the Luma plane and added to the result of the area resample of the red and green planes. In embodiments disclosed herein, the blue plane need not be sharpened at least for two reasons. First, because the human vision system does not focus on blue light simultaneously with the longer wavelengths, the blue sub-pixel may be greatly subsampled. Second, sampling the Luma plane for sharpening yellow, green, and red sub-pixel image reconstruction allows for luminance modulation on the blue data plane to be expressed on the yellow, green, and red images. The derivation of the sharpening filter kernel for the red and green subpixels is $$\begin{matrix} 0 & 0 & 2 & 0 & 0 \\ 0 & 4 & 8 & 4 & 0 \\ 2 & 8 & 8 & 8 & 2 \\ 0 & 4 & 8 & 4 & 0 \\ 0 & 0 & 2 & 0 & 0 \end{matrix} - \begin{matrix} 1 & 2 & 2 & 2 & 1 \\ 2 & 4 & 4 & 4 & 2 \\ 2 & 4 & 4 & 4 & 2 \\ 2 & 4 & 4 & 4 & 2 \\ 1 & 2 & 2 & 2 & 1 \end{matrix} = \begin{matrix} -1 & -2 & 0 & -2 & -1 \\ -2 & 0 & 4 & 0 & -2 \\ 0 & 4 & 4 & 4 & 0 \\ -2 & 0 & 4 & 0 & -2 \\ -1 & -2 & 0 & -2 & -1 \end{matrix}$$

In an embodiment, a full-color display may include multiple pixels, each of which has a pixel arrangement as shown in FIG. 2, with multiple OLED sub-pixels in each pixel. That is, the structure shown for sub-pixel 305 may be repeated for other sub-pixels within each pixel. For example, a blue LED may be paired with two or three OLED sub-pixels having the basic structure as shown for sub-pixel 305. As a specific example, green, red, and yellow OLED sub-pixels may be used, where each OLED sub-pixel includes either an emissive stack that generates the same color as is ultimately emitted by the sub-pixel, i.e., green, red, and yellow OLED stacks, respectively. Alternatively, one or more OLED sub-pixels may include an emissive stack that generates an initial color of light that is then converted to the color emitted by the sub-pixel, as previously disclosed. Alternatively, two or more OLED sub-pixels may share a common OLED stack, with the sharing sub-pixels being defined by individual electrodes, as previously disclosed. As a specific example, a yellow emissive stack may be used by red and green OLED sub-pixels, each of which has a different color altering layer disposed in a stack with a separate electrode to form the sub-pixel. In some embodiments, three OLED sub-pixels may be used, such as red and green as previously described as well as an unfiltered (i.e., no color altering layer) yellow OLED sub-pixel. The use of such an RGBY architecture may provide for better efficiency and power usage than conventional RGB or RGBW arrangements. Generally, blue and yellow will be used to render images most of the time, other than when very saturated green and red colors are required. This allows for the display to have a high or wide color gamut without a power consumption penalty.

In an embodiment, a further increase in color gamut may be achieved by using a six-color display, such as a deep blue from LED and five OLED sub-pixels, such as yellow, yellow, light green (550 nm-600 nm), deep green (500 nm-550 mnm), light red (580 nm-630 nm) and deep red (630 nm-700 nm). In such a configuration, the deep green and deep red generally are only used a small percentage of the time, so their relatively lower efficiency will not significantly impact the overall display power consumption. These very saturated colors may be achieved by applying color altering layers over portions of a yellow OLED stack as previously described, and further facilitated if the corresponding sub-pixels or corresponding portions of the emissive stack are placed in micro-cavities. For example, portions of the yellow emissive stack may be placed in microcavities to shift the spectral output to favor deep red or deep green as appropriate. Such an approach may be desirable, for example, to achieve the full ITU-R Recommendation BT.2020 ("REC 2020") color gamut.

Alternatively or in addition, the color gamut of a display as disclosed herein may be improved by adjusting the specific emission of the yellow sub-pixels. For example, the yellow OLED emissive materials may be chosen so as to provide emission as close to the "line of yellows" in the 1931 CIE diagram as possible.

Figure 3F:
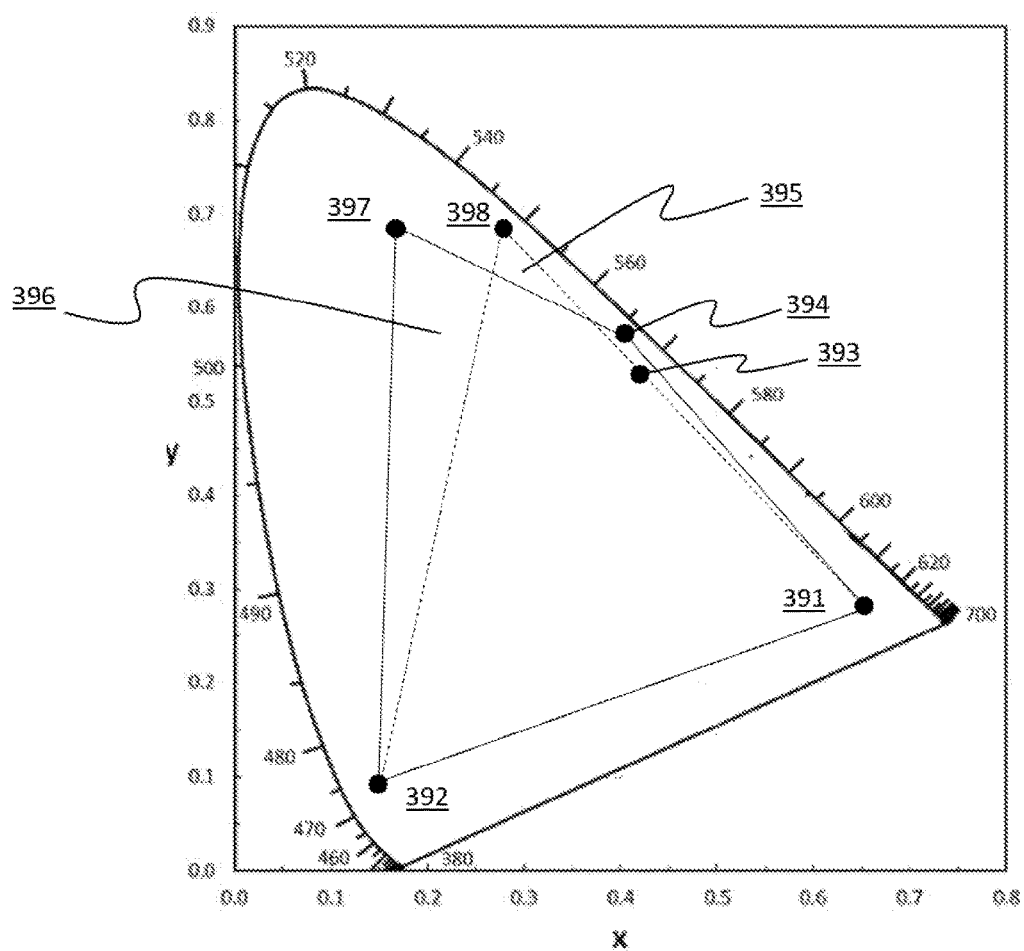
FIG. 3F shows a 1931 CIE diagram with conventional RGB points and four-emitter RGBY points according to embodiments disclosed herein.

In a classic three color system using red, green, and blue primary emitters, there is a trade-off between capturing the colors close to the spectral locus from the longest visible wavelengths (i.e., deep red) to the mid-visible wavelengths (i.e., yellowish green) at about 525 nm called the "line of yellows," and choosing a green that allows for capture of more colors that lie closer to the spectral locus from the short-mid lengths (i.e., emerald green) to the shortest visible wavelengths (i.e., deep blue) called the "line of blues" or "line of cyans". This is due to the nature of the realizable green color primaries and the curved shape of the color space along the mid-wavelengths around the greens. The spectral locus in the mid-wavelengths is highly curved and thus the mapped "distance" between wavelengths is greater. This may make it relatively difficult to select a green that will allow a color gamut triangle that lies close to both the "line of yellows" and the "line of blues" simultaneously. FIG. 3F shows the 1931 CIE diagram with examples of conventional red, green, and blue emitters 391, 392, 398, respectively. The corresponding conventional color gamut is thus the area within the dotted lines. A conventional yellow point is shown at 393.

According to embodiments disclosed herein, in a four-color system such as an RGBY system, colors may be selected so as to provide a color gamut that better captures colors that lie close the spectral locus along the "line of yellows" and comparatively closer to the "line of blues". For example, one such possible combination of colors may be obtained by selecting a yellow primary color point 394 having a dominant spectral distribution that is shorter than 580 nm but longer than 550 nm, and a green primary color point 397 having a dominant spectral distribution between 525 nm and 510 nm. When combined with a deep blue 392, for example in the range of 450-455 nm and a deep red 391, for example in the range 620-625 nm, this will provide a quadrilateral color gamut that lies very close to the line of yellows and reasonably closer to the line of blues. The Y' emitter 394 is placed closer to the green side than would be typically be the case in a conventional RGB arrangement. The G' emitter 397 may be formed from yellow OLED material and use of a color filter, cavity structure, or similar structure that moves the resultant color point away from the line of yellows. Such an arrangement may allow the display to render new colors containing more blue colors as shown. For example, the corresponding color gamut includes the area 396 that is inaccessible in the conventional gamut. Depending upon the specific green and yellow points selected, there may be a small "lost" portion of the gamut 395 relative to a conventional arrangement.

In an embodiment, one or more LED sub-pixels may be shared among four pixels. Such a configuration may reduce the required resolution and positional accuracy requirements of placing the LEDs, and thereby increase the manufacturing yield. In addition, relatively large blue sub-pixels may allow for multiple LEDs to be positioned in each sub-pixel, thereby providing redundancy without impacting the resolution of the display, which also may greatly increase display manufacturability. These differences between the geometry and number of blue and other sub-pixels may not adversely affect apparent display quality because, although display resolution has increased over time, the ability of the human vision system to resolve blue wavelengths has remained the same. The number of blue sub-pixels relative to red, green, and/or yellow sub-pixels accordingly may be relatively low with little perceivable effect on image quality.

As a specific example, in some embodiments each blue sub-pixel in a pixel may include two blue LEDs arranged in parallel. Contact pads may be provided for two independent LEDs in parallel, and connected to the same driver TFT. As the driver TFT acts as a current source, the same current will flow in each blue sub-pixel whether both or only one LED is operational, resulting in very similar light output. Such an arrangement thereby protects against failure of one of the LEDs without significant impact to the display luminance or color gamut. Similarly, multiple LEDs within a sub-pixel may be arranged in series to protect against shorting of the LEDs. Both arrangements may be used concurrently, such as where two pairs of series LEDs are arranged in parallel, to provide simultaneous protection against damage, shorting, or other failure, without significant impact to the apparent operation or manufacturability of the sub-pixel.

Figure 4:
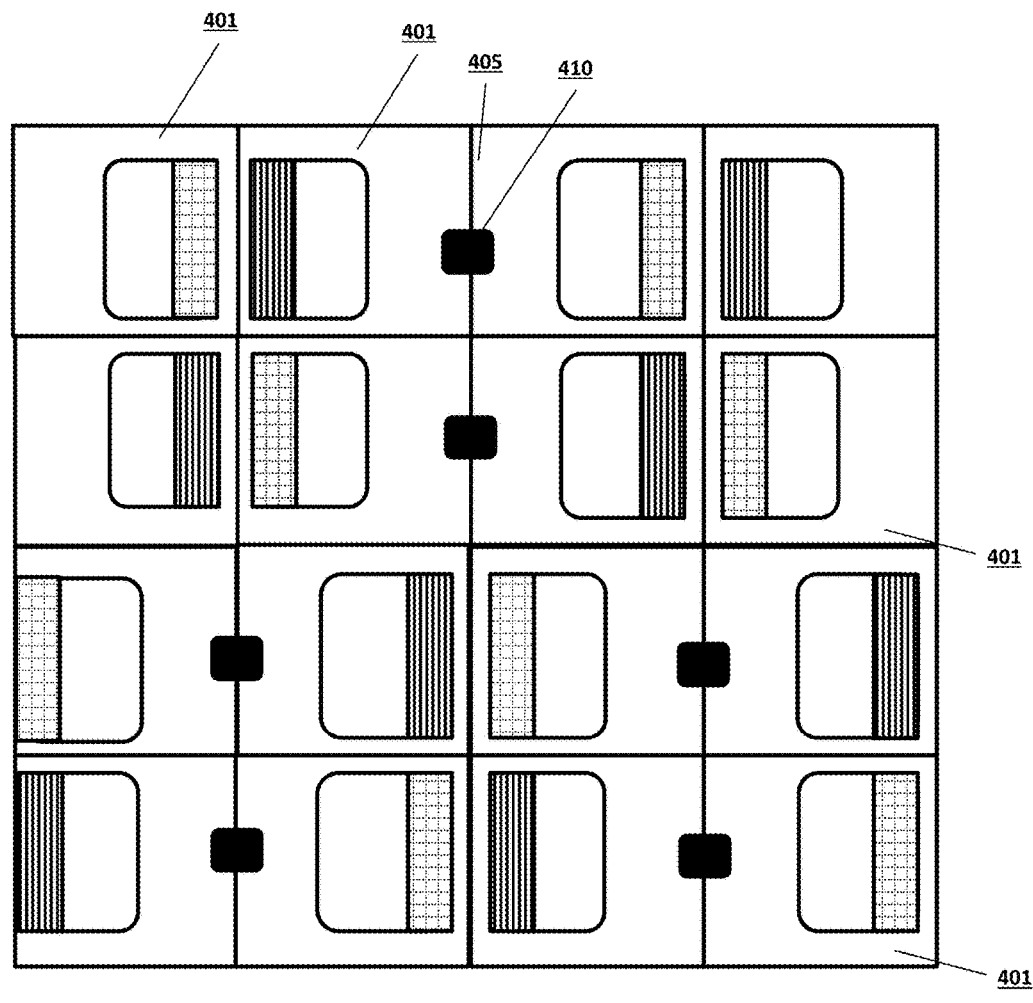
FIG. 4 shows an example schematic pixel arrangement according to an embodiment disclosed herein.

FIG. 4 shows an example schematic pixel arrangement according to an embodiment disclosed herein. As previously described, each pixel 401 in the arrangement may include one or more blue sub-pixels 405, each of which may include one or more inorganic LEDs 410. In the illustrative arrangement shown in FIG. 4, each blue emissive region, each of which includes two blue LEDs in the example, is shared among four sub-pixels, but other arrangements as previously described may be used in which each blue emissive region is shared among a different number of pixels, or in which each pixel includes a separate blue LED, or in which the blue emissive region includes one or a different number of LEDs. Each pixel also may include yellow, green, and/or red sub-pixels, each of which may include an emissive OLED organic stack. As previously described, the OLED stack in each sub-pixel may be a portion of a unpatterned OLED stack, such as where an unpatterned yellow organic stack is used in conjunction with red and green color altering layers to form sub-pixels as shown. The use of an unpatterned OLED stack means that the sub-pixel fill factors may be determined by photolithography, such as by anode patterning or the use of color altering layers. That is, although a larger-scale device as disclosed herein may include a "pattern" or may be fabricated using patterning methods across the device as a whole, no patterning of the organic films in the OLED stack or stacks within the device is required, such as at the level of individual pixels or sub-pixels. As a result, much higher fill factors can be achieved than for a conventional RGB patterned side by side OLED display that includes separately patterned OLED emissive layers for each different colored sub-pixel, or stacks of different colors. In addition, the blue sub-pixel may have the smallest fill-factor as previously disclosed, due to relatively high lifetime and efficiency of blue LEDs. This in turn may allow for a larger sub-pixel aperture ratio for the yellow or other sub-pixels, further increasing display lifetime, and/or allowing more space to implement other architectures such as a six-color architecture for very wide color gamut display as previously described. The use of an unpatterned organic stack also may improve the manufacturability of the display, for example, by eliminating the need for patterning at the pixel level, and thus and otherwise allowing for lower manufacturing costs than would otherwise be achievable.

Embodiments disclosed herein may use top and/or bottom emission OLEDs. A basic OLED stack including the anode assembly may be optimized for a yellow OLED stack as previously described. Examples of various arrangements and anode patterns that may be used with embodiments disclosed herein are provided in U.S. Pub. No. 2015/0340410, the disclosure of which is incorporated by reference in its entirety. Color altering layers such as color filters may be used as disclosed herein regardless of whether top- or bottom-emission OLED structures are used. For example, in bottom-emission structures, color filters may be patterned on the backplane, under the OLED stack, using photolithographic techniques. For top-emission structures, color filters may be patterned on a lid which is aligned and sealed to the substrate, such as lid 315 in FIG. 3A.

Because LEDs are relatively small on the scale of conventional OLED sub-pixel devices, transparent hybrid displays as disclosed herein may be fabricated using techniques similar to those used for conventional transparent OLED (TOLED) displays. Metal bus lines, TFTs and the LED chip may limit the overall transparency of such a device. However, an unpatterned OLED stack as disclosed herein may be fabricated to be transparent without a color filter. For example, a transparent yellow OLED stack may be fabricated without a color filter.

Hybrid displays and pixel arrangements as disclosed herein may be flexible. For example, a plastic or barrier-coated plastic may be used as a substrate, with flexible OTFT or oxide backplanes. As another example, LTPS may be used. As shown in FIG. 3A, the interface between the rigid inorganic LEDs and the top of the TFT backplane may be a limiting interface of a hybrid arrangement in terms of flexibility. Thus, for a flexible display, it may be preferable for the "neutral plane" to be relatively close to this interface. When a thin device is flexed, the neutral plane runs through the device and defines a plane which does not expand or contract on flexing. Regions on one side of the neutral plane are in tensile stress, and regions on the other side are in compressive stress when the device is flexed. To avoid delamination or cracking of materials, it may be desirable for a thin display to include stiff or inorganic materials close to the neutral plane. The neutral plane will be in the middle of a symmetrical structure, and can be moved away from this position by materials having a large Young's modulus multiplied by their thickness, particularly if these films are placed away from the middle of the device. In a hybrid display as disclosed herein, the inorganic LEDs generally will dominate the positioning of the neutral plane due to their thickness and rigidity. Thus, the neutral plane typically will lie approximately half way up the height of the LEDs assuming an otherwise symmetrical display structure. The current-carrying electrodes for the OLED stack also may have a relatively large Young's modulus, and so the position and thickness of these electrodes also may determine how the neutral plane is positioned within the device. Buslines placed under LEDs near the TFTs will tend to pull the neutral plane down towards the substrate, and therefore near to the micro LED to backplane interface. So a hybrid display as disclosed herein also may allow for all the current-carrying electrodes to be below the micro LEDs.

Figure 5:
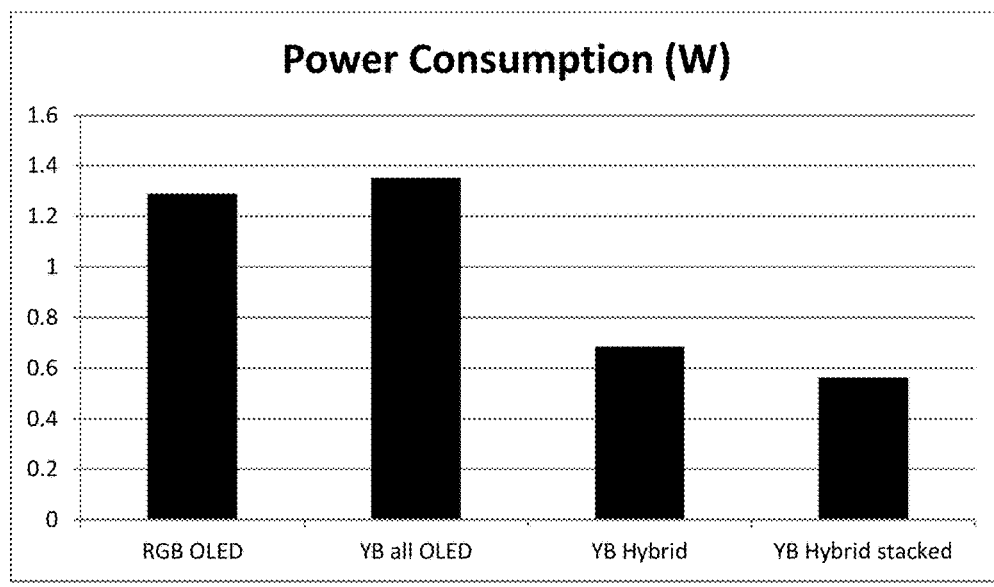
FIG. 5 shows an example of power consumption for a conventional display, and for various hybrid displays as disclosed herein.

FIG. 5 shows an example of power consumption for a conventional RGB display, a YB display implemented using only conventional OLED devices, a YB hybrid arrangement as disclosed herein with a single junction yellow, and a hybrid arrangement as disclosed herein using a stacked (two device) yellow OLED stack. As shown, the YB hybrid may achieve greater than a 56% power savings over the conventional RGB OLED display. This increased efficiency may be realized through lower power consumption, a smaller power source, or a brighter display at the same power consumption. Conventional OLED display luminance generally is limited by the shortest lifetime of a sub-pixel, typically the blue sub-pixel or sub-pixels. However, in a hybrid display architecture as disclosed herein, the lifetime may increase by at least a factor of 10, 20, 30, or more, thus allowing for operation at higher luminances and daylight readability or HDR operation, with significantly reduced image sticking. A conventional phosphorescent yellow OLED device typically has an LT95 of about 50,000 hours at 3,000 $cd/m^2$. For a daylight readable display operating at greater than 700 $cd/m^2$, the maximum yellow sub-pixel luminance would be about 8,000 $cd/m^2$, correspond to an LT95 of about 7,000 hours. Use of a stacked yellow OLED structure as disclosed herein may increase the lifetime by a factor of three or more, leading to a display lifetime of over 20,000 hours at an operating display luminance of 1000 $cd/m^2$ or more.

In an embodiment, only PL organic films may be used, and color altering layers may be used to convert blue light emitted by the LEDs to yellow, thus providing a device as disclosed herein that includes no actively-driven OLEDs. Blue LEDs thus may be used for each sub-pixel, each driven directly from TFT backplane. In such a configuration the density of LEDs may be higher, though they would only be of the single color. The color altering layer also may be patterned to avoid down conversion of the blue to yellow in the blue sub-pixel.

In an embodiment production yield may be increased by testing the substrate after positioning the blue LEDs but prior to OLED deposition. Connecting the gate and data lines together may enable all blue sub-pixels in a device as disclosed herein to be energized, so that a camera may record LED yield prior to OLED deposition.

Alternatively or in addition, in some embodiments corrections may be provided for low yield, transfer failure, die-to-die, wafer-to-wafer, or lot-to-lot luminance efficiency variations, or other failures of LED components in a hybrid display as disclosed herein. In many conventional approaches, LEDs including micro-LEDs may be difficult to pre-test before transfer and metallization. Accordingly, some embodiments may use compensation techniques to "mask" or compensate for a non-functional ("dead") blue LED sub-pixel.

Figure 6A:
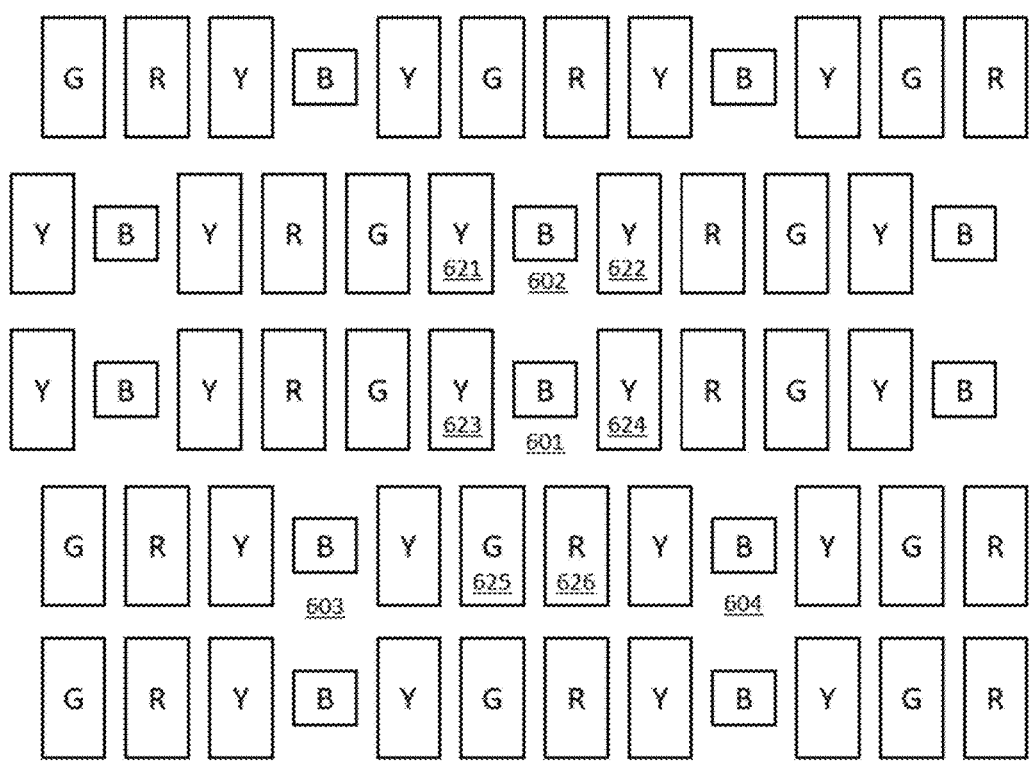
FIG. 6A and FIG. 6B show schematic examples of pixel arrangements according to embodiments disclosed herein.
Figure 6B:
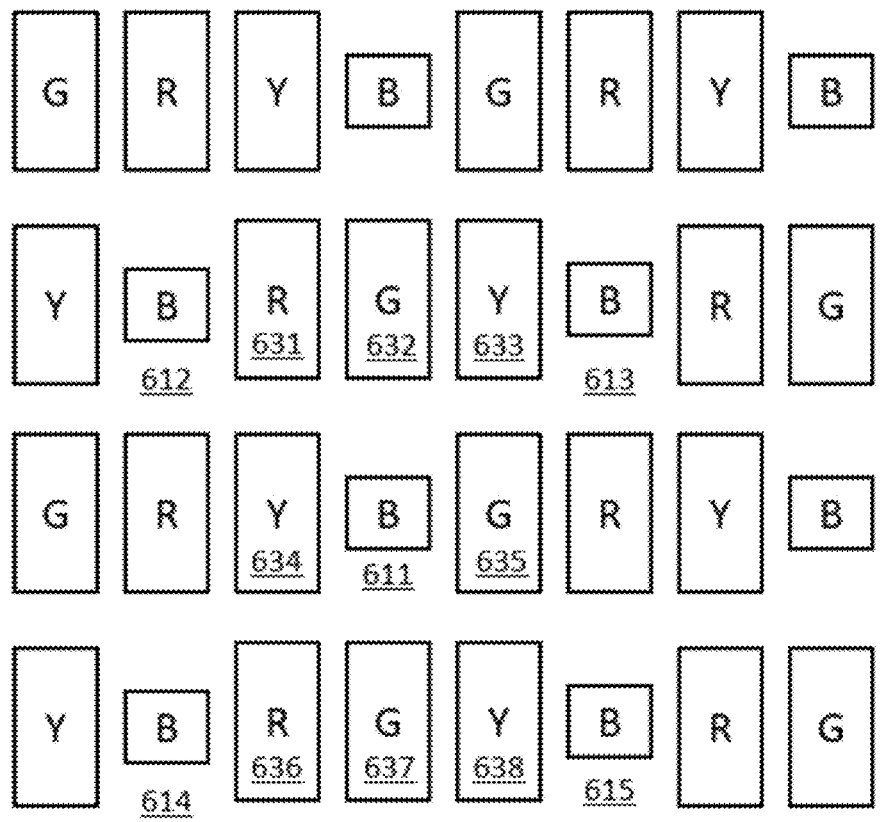

In a first-order correction, the blue energy that the dead pixel would have rendered may be "shifted" to the nearest blue neighbors. That is, a display may compensate for a dead sub-pixel by increasing the energy output of other sub-pixels in approximately the same region of the display. In view of the relatively high resolution of modern displays and the human eye's relatively low sensitivity to blue light, such techniques may compensate for the dead pixel without any perceivable difference or variation in resolution, picture quality, luminance, or the like. So, for example, if there are 4 blue nearest neighbors, then 25% of the luminance of the dead pixel would be shifted to these nearest working blue sub-pixels. More generally, a display may be configured to shift energy that would have been provided by a dead sub-pixel to any selected number of sub-pixels near the dead sub-pixel. As a specific example, FIGS. 6A and 6B show example schematic pixel arrangements according to embodiments disclosed herein. It will be understood that FIGS. 6A and 6B only show the relative placement of various sub-pixels for illustration. The specific relative sizes, composition, drive circuitry, and other aspects of such an arrangement may be consistent with any of the embodiments disclosed herein. FIG. 6A shows an arrangement similar to that discussed previously with respect to FIG. 4. In this arrangement, a dead blue sub-pixel 601 may have three "nearest" neighbor blue sub-pixels that could be used to compensate for the lack of energy provided by the dead sub-pixel—602, 603, and 604. As another example, only some of those sub-pixels, such as sub-pixels 603 and 604, may be used to compensate for the dead sub-pixel. As another example, in FIG. 6B, sub-pixels 612, 613, 614, and 615 may be used to compensate for a dead sub-pixel 611. Since arrangements as shown in FIGS. 6A and 6B typically repeat across a display, each blue LED sub-pixel will similarly have a number of neighboring sub-pixels that may be used to compensate for the sub-pixel if it is non-functional initially or later becomes non-functional during operation of the display.

Various schemes may be used to determine the additional energy that should be provided by each compensating sub-pixel. For example, the energy may be distributed equally to the four nearest micro-LEDs. A specific filter to use may be determined using Area Resample Theory.

In some embodiments, second-order masking correction for a dead sub-pixel may be performed by transferring an equal amount of luminance energy that would have been provided by the dead blue sub-pixel, to the location of the dead pixel, but using other red, green, and/or yellow sub-pixels located at or in the immediate region of the dead blue sub-pixel. This may be desirable because, although deep blue sub-pixels generally do not provide much luminance relative to the entire pixel, there is some loss that may be visible. For example, in FIG. 6A, some or all of the red, green, and yellow sub-pixels 621, 622, 623, 624, 625, and 626 may be used to compensate for the "missing" luminance for a dead blue sub-pixel 601. Similarly, some or all of the sub-pixels 631, 632, 633, 634, 635, 636, 637, 638 may be used to compensate for missing luminance of a dead sub-pixel 611.

More generally, a dead blue sub-pixel may be corrected for by using neighboring blue pixels to provide the lost blue luminance, and/or using red, green, and/or yellow RGY sub-pixels at or near the same location to provide the missing luminance. Such techniques may be used regardless of whether the blue sub-pixel is dead due to yield problems, consistency problems within a lot, or other LED failures, thus allowing for potential shortcomings of blue micro-LEDs to be overcome.

In an embodiment, LEDs and OLED stacks as disclosed herein may be deposited on separate substrates. For example, the OLED stack may be disposed on an active matrix substrate, with a top emission configuration. The LED components may be patterned on a lid with color filters and driven in a passive matrix mode to avoid the cost and complexity of two backplanes. LEDs generally may be lower resolution than the OLED stack, and thus more suited to being driven with a passive matrix.

In some configurations, it may be preferred to have a smaller number of larger blue micro-LEDs, rather than smaller LEDs in higher quantity because smaller micro-LED dies generally have lower efficiency than larger dies, due to edge effects that impair device efficiency. The smaller number of LEDs may be more efficient from a power consumption perspective, as well as reducing the number of transfers and thereby simplifying the display fabrication process.

Figure 7:
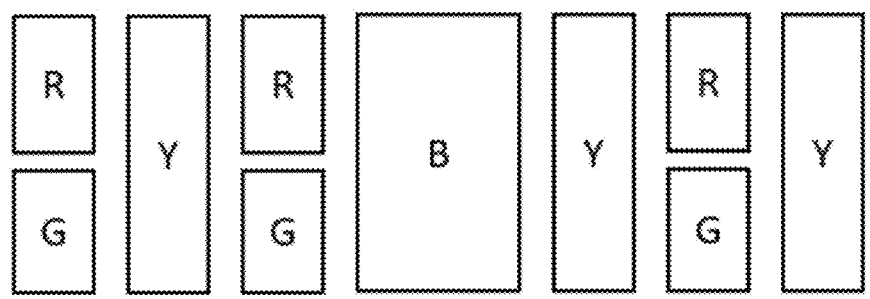
FIG. 7 shows an example pixel arrangement with active areas shown approximately to scale relative to one another according to an embodiment disclosed herein.

As previously disclosed, a benefit of embodiments disclosed herein that use only blue micro-LEDs may be that the lower spatial resolution of the human eye to blue light means that if an isolated blue sub-pixel is not functional, a display image may be corrected in software and/or operation of the display to overcome the defect and make it not appear visible. Given that the human eye's resolution to blue light is approximately 4 cycles per degree, while being greater than 30 cycles per degree for yellow light, on an area basis only one blue sub-pixel is needed for every 64 yellow sub-pixels. This indicates that embodiments disclosed herein may benefit from 64×3=192 fewer transfers than would be required for an RGB display having only inorganic LEDs or micro-LEDs. In an embodiment, a preferred arrangement may include one blue sub-pixel for every 16 pixels. Such an arrangement still has 48 times fewer transfers than a micro-LED RGB display, but still does not require 100% micro-LED transfer yield. This is because, as previously disclosed, individual blue sub-pixel defects may be corrected by operating other sub-pixels to compensate for the defect(s) (e.g., through software executed by the display), because the blue sub-pixel density relative to yellow sub-pixel density is still higher than can be visually resolved by the human eye. In addition, each blue micro-LED may be 16 times larger than one that would be used if one blue sub-pixel was employed per pixel, greatly increasing the micro-LED efficiency and, in some cases, improving the functional yield of the LEDs. That is, there may be not more than one blue sub-pixel for every 16 pixels in a display. Similarly, the blue micro-LEDs in such a configuration may provide 25% or more of the total sub-pixel active area. This is in contrast to conventional inorganic LED display techniques, which typically seek to have each individual LED be as small as possible. In embodiments disclosed herein, however, it may be desirable for the inorganic micro-LEDs to be at least 25% of the sub-pixel active area. An example of a sub-pixel arrangement with sub-pixel active areas shown approximately to scale is shown in FIG. 7. As with other sub-pixel arrangements disclosed herein and other arrangements known in the art, it will be understood that this or a similar arrangement may be repeated in rows across a display active area, for example by providing like-color sub-pixels in columns, or by offsetting alternating rows by the width of one or more sub-pixels. The sizes of the red, green, and yellow sub-pixels relative to one another also may be different, such as where the yellow sub-pixel has the same active area as the red and/or green sub-pixel, in which case the size of the blue LED sub-pixel also may be adjusted accordingly so as to provide an active area of at least 25% of the total sub-pixel active area.

In an embodiment, an inorganic blue LED may be shared among multiple pixels, where the remainder of the sub-pixels are provided by side-by-side red and green sub-pixels, with no other colors of sub-pixels in the display. For example, red and green sub-pixels may be deposited and patterned using masks that have half the resolution of the final display. However, no color filters or other color altering layers are required, and each red and/or green OLED may be configured to take advantage of a cavity design. To fabricate a side-by-side display, two organic emissive depositions may be performed, each made through a mask that has half the resolution of the display. Blue LEDs may then be placed below the OLED plane as previously disclosed, and one blue LED may be used for 4, 16, or 64 pixels as previously disclosed. Such an arrangement may have significantly lower power consumption than conventional OLED displays, as well as higher brightness and longer lifetime at higher resolution. For configurations having one blue sub-pixel for every 16 pixels, such a configuration requires only 2% of the micro-LED transfers that would be required for a display having only LEDs.

Figure 8A:
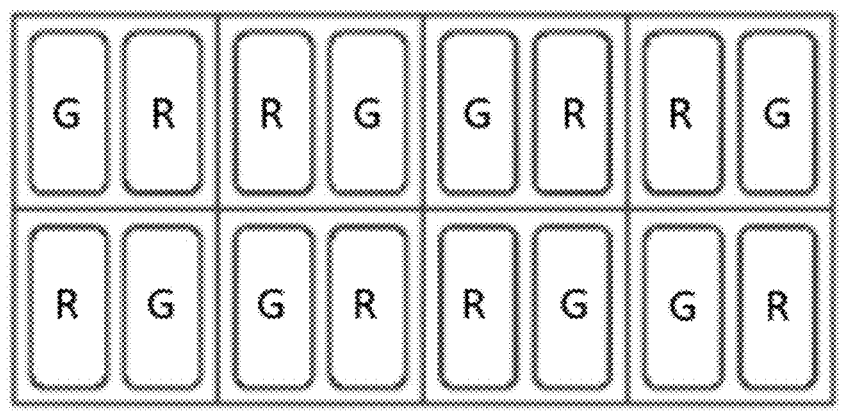
FIG. 8A shows an example arrangement of green and red OLED depositions suitable for use in embodiments disclosed herein.
Figure 8B:
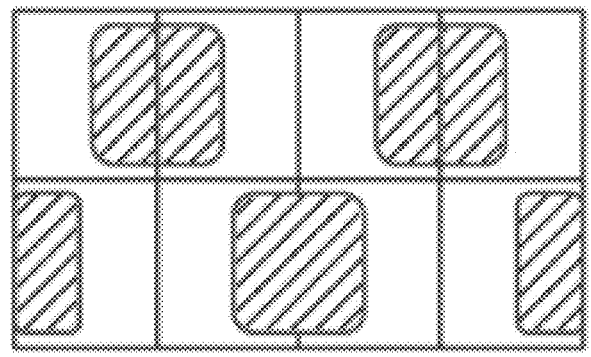
FIG. 8B shows a mask arrangement that may be used to deposit the green and red OLED depositions in FIG. 8A according to embodiments disclosed herein.

FIG. 8A shows an example arrangement of green and red OLED depositions suitable for use in such an arrangement, and FIG. 8B shows the corresponding mask arrangement that may be used to deposit the green and red OLED depositions. Notably, relative to conventional mask arrangements the mask openings are much larger, allowing for deposition of OLED emissive regions for two pixels simultaneously through each opening. This arrangement provides an increased fill factor relative to conventional masked OLED deposition techniques, while only requiring one tolerance threshold per pixel instead of one tolerance per sub-pixel deposition. In addition, each OLED deposition may extend to the pixel edge in the x-direction, further improving efficiency and fill factor of the display.

Similar techniques are disclosed in U.S. Pat. Nos. 9,385, 168, 9,590,017, and 9,424,772, the disclosure of each of which is incorporated by reference in its entirety. However, embodiments disclosed herein may use similar techniques with red and green depositions instead of yellow and blue depositions as disclosed in these patents.

In an embodiment, a passive matrix arrangement may be used. This may extend the usage range for PMOLED displays, as only the yellow OLED may need to be considered at high drive conditions, thus allowing for a higher luminance and more row lines than would otherwise be achievable. This may lower the fabrication cost and complexity for small displays, and remove substrate temperature constraints. Such configurations may be used for display that require relatively high flexibility, such as wearable displays.

As previously described, embodiments disclosed herein may use partially- or completely-transparent OLEDs, such as to allow LEDs to be placed in a different plane than OLED emissive region depositions. In some embodiments, a portion of an electrode, such as the anode, may be made reflective instead of having an entirely transparent electrode. This may allow for the OLED stack to provide beneficial cavity effects without reducing the fill factor due to use of the LEDs as previously disclosed. Furthermore, the color alteration resulting from having a small area that does not produce a cavity (corresponding to the transparent portion of the electrode) will be minimal, and may not be perceivable by a regular observer.

Embodiments disclosed herein may be particularly beneficial for digital signage, which typically has requirements for high luminance, low resolution, and low frame rate. For example, a conventional large-scale (84-inch diagonal or larger) signage may operate at 2500 $cd/m^2$ with a power consumption of 2800 W. A hybrid arrangement as disclosed herein may not require a polarizer, and, assuming a 50% of efficiency for an active-matrix OLED arrangement, may consume only 600 W for comparable luminance operation. For example, embodiments disclosed herein may be operable to achieve 700 $cd/m^2$ or more, while drawing 10 $mW/cm^2$ or less at a white point of the display. As used herein, a white point of a display refers to the white point correlated color temperature value of the display. White light emitted by a display as disclosed herein typically defined with regard to its chromaticity coordinates in the CIE 1931 XYZ color space chromaticity diagram. Often in display applications the white point is described by a value such as D65, D50 or the like, which refers to white light having a correlated color temperature (CCT) of 6500 K (D65), 5000K (D50), and so on. Embodiments disclosed herein typically may have a white point in the range of D50 to D90, though some embodiments may include a white point outside of this range. These CCT values correspond to white points on the blackbody curve, but in practice white light will not be exactly on the blackbody curve, but close to it, with some error in both the x and y co-ordinate. As used herein, "white light" thus refers to a mixture of light from sub-pixels that produce a white light closest to the blackbody curve.

Embodiments disclosed herein also may be capable of operating at a relatively high luminance compared to conventional large-scale displays and conventional OLED displays, such as 1000 $cd/m^2$, 2000 $cd/m^2$, or more. More generally, relatively high luminance may be achieved using a hybrid arrangement as disclosed herein, while maintaining the benefits of an OLED display such as flexible substrates and curved displays.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A pixel arrangement for a full-color display, the arrangement comprising:
   a first sub-pixel configured to emit a first color, the first sub-pixel comprising an inorganic light-emitting diode (LED);
   a second sub-pixel configured to emit a second color, the second sub-pixel comprising a first portion of a first organic emissive stack configured to emit an initial color different from the first color; and
   a single data driver configured to provide luminance information to each of the first sub-pixel and the second sub-pixel.

2. The pixel arrangement of claim 1, wherein the second sub-pixel comprises a green OLED having first CIE coordinates, and further comprising:
   a third sub-pixel comprising red OLED having second CIE coordinates; and a fourth sub-pixel comprising a yellow OLED having third CIE coordinates;
wherein the third CIE coordinates lie to the right of a line between the first CIE coordinates and the second CIE coordinates on the 1931 CIE color chart.

3. The pixel arrangement of claim 1, wherein the data driver provides a voltage $V_{dd}$ corresponding to a required overall luminance for the first sub-pixel.

4. The pixel arrangement of claim 3, wherein the voltage is converted into a time for which the LED is driven at a constant current.

5. The pixel arrangement of claim 4, wherein the constant current I is set by a resistor having resistance R and a driver saturation voltage $V_{sat}$ such that $I=(V_{dd}-V_{sat}-V_{LED})/R$.

6. The pixel arrangement of claim 1, wherein the data driver provides a global ramp voltage to each LED in the pixel arrangement.

7. The pixel arrangement of claim 6, wherein the ramp voltage increases from a minimum value to a maximum value in a time required to address each scan line in the pixel arrangement.

8. The pixel arrangement of claim 1, further comprising a comparator to set a pulse width of the data driver.

* * * * *